US012688889B2

(12) United States Patent
Nam et al.

(10) Patent No.: US 12,688,889 B2
(45) Date of Patent: Jul. 21, 2026

(54) SEMICONDUCTOR DEVICE WITH ALTERNATING BITLINES AND STRING SELECT LINES AND ELECTRONIC SYSTEM INCLUDING THE SAME

(71) Applicant: SAMSUNG ELECTRONICS CO., LTD., Suwon-si (KR)

(72) Inventors: Hanmin Nam, Suwon-si (KR); Jeunghwan Park, Suwon-si (KR); Changyeon Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 18/388,956

(22) Filed: Nov. 13, 2023

(65) Prior Publication Data

US 2024/0170067 A1     May 23, 2024

(30) Foreign Application Priority Data

Nov. 18, 2022     (KR) ........................ 10-2022-0155398

(51) Int. Cl.
  *G11C 16/08*     (2006.01)
  *G11C 8/12*     (2006.01)
  (Continued)

(52) U.S. Cl.
  CPC ................ *G11C 16/08* (2013.01); *G11C 8/12* (2013.01); *G11C 16/0433* (2013.01); *G11C 16/24* (2013.01); *H10B 41/10* (2023.02); *H10B 41/35* (2023.02); *H10B 41/50* (2023.02); *H10B 43/35* (2023.02); *H10B 43/50* (2023.02)

(58) Field of Classification Search
  CPC ....... G11C 16/08; G11C 8/12; G11C 16/0433; G11C 16/24; G11C 5/063; G11C 7/18; G11C 16/0483; G11C 7/12; G11C 8/08; H10B 41/10; H10B 41/35; H10B 41/50; H10B 43/35; H10B 43/50; H10B 41/27;
  (Continued)

(56) References Cited

U.S. PATENT DOCUMENTS 7,778,058 B2     8/2010  Kim
8,395,190 B2     3/2013  Shim et al.
  (Continued)

FOREIGN PATENT DOCUMENTS

KR     10-0851547 B1     8/2008
KR     10-1624975 B1     5/2016
  (Continued)

OTHER PUBLICATIONS

Communication issued by the Korean Patent Office dated May 21, 2026 in Application No. 10-2022-0155398.

*Primary Examiner* — Donald HB Braswell
(74) *Attorney, Agent, or Firm* — Sughrue Mion, PLLC

(57) ABSTRACT

A semiconductor device includes word lines disposed on a substrate and spaced apart in a first direction perpendicular to an upper surface of the substrate, a string select line disposed on the word lines, memory strings extending in the first direction on the substrate, each memory string including a first channel extending in the first direction through the word lines, and memory cells constituted by the word lines around the first channel, bit lines electrically connected to the memory strings, and a strapping line connected to the string select.

18 Claims, 23 Drawing Sheets

(51) Int. Cl.
*G11C 16/04* (2006.01)
*G11C 16/24* (2006.01)
*H10B 41/10* (2023.01)
*H10B 41/35* (2023.01)
*H10B 41/50* (2023.01)
*H10B 43/35* (2023.01)
*H10B 43/50* (2023.01)

(58) Field of Classification Search
CPC ........ H10B 43/10; H10B 43/27; H10B 41/40;
H10B 43/40
See application file for complete search history.

(56) References Cited

U.S. PATENT DOCUMENTS

| | | | | |
|---|---|---|---|---|
| 9,478,290 | B1 | 10/2016 | Nam et al. | |
| 11,121,149 | B2 | 9/2021 | Tanaka et al. | |
| 11,322,516 | B2 | 5/2022 | King et al. | |
| 2005/0056869 | A1* | 3/2005 | Ichige .................... | H10B 43/30 |
| | | | | 257/E21.679 |
| 2018/0358056 | A1* | 12/2018 | Lee ........................ | H10B 43/40 |
| 2020/0388336 | A1* | 12/2020 | Yun ........................ | G11C 16/08 |
| 2020/0402590 | A1* | 12/2020 | Park ....................... | G11C 16/24 |
| 2021/0066282 | A1* | 3/2021 | Kim ....................... | H10D 88/00 |
| 2021/0288054 | A1 | 9/2021 | Ryu et al. | |
| 2022/0093621 | A1 | 3/2022 | Lee | |
| 2022/0102372 | A1 | 3/2022 | Choi | |

FOREIGN PATENT DOCUMENTS

| | | | |
|---|---|---|---|
| KR | 10-2021-0117705 A | 9/2021 | |
| KR | 20210123804 A | 10/2021 | |

* cited by examiner

SEMICONDUCTOR DEVICE WITH ALTERNATING BITLINES AND STRING SELECT LINES AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0155398, filed on Nov. 18, 2022, in the Korean Intellectual Property Office, the disclosure of which being incorporated by reference herein in its entirety.

BACKGROUND

The present disclosure relates to a semiconductor device and an electronic system including the same, and more particularly, to a semiconductor device having a vertical channel and an electronic system including the same.

In an electronic system requiring data storage, a semiconductor device capable of storing high-capacity data is required. Accordingly, a method of increasing the data storage capacity of a semiconductor device is being studied. For example, as one of the methods of increasing the data storage capacity of a semiconductor device, a semiconductor device including memory cells arranged three-dimensionally instead of memory cells arranged two-dimensionally has been proposed.

SUMMARY

It is an aspect to provide a semiconductor device having a reduced resistance of a string select line or reduced wiring resistance.

It is another aspect to provide an electronic system including the semiconductor device.

According to an aspect of one or more embodiments, there is provided a semiconductor device including a plurality of word lines disposed on a substrate and spaced apart in a first direction perpendicular to an upper surface of the substrate, a string select line disposed on the plurality of word lines, a plurality of memory strings extending in the first direction on the substrate, each memory string including a first channel extending in the first direction through the plurality of word lines, and a plurality of memory cells constituted by the plurality of word lines around the first channel, a plurality of bit lines electrically connected to the plurality of memory strings, and a strapping line connected to the string select line.

According to another aspect of one or more embodiments, there is provided a semiconductor device including a peripheral circuit disposed on a substrate, and a memory cell stack disposed on the peripheral circuit, wherein a memory cell stack includes a common source plate, a plurality of word lines spaced apart from each other in a first direction perpendicular to an upper surface of the substrate on the common source plate, a string select line disposed on the plurality of word lines, a plurality of memory strings extending in the first direction on the common source plate, wherein each memory string includes a first channel extending in the first direction through the plurality of word lines and a second channel extending in the first direction through the string select line, a plurality of bit lines electrically connected to the plurality of memory strings, and a strapping line connected to the string select line.

According to yet another aspect of one or more embodiments, there is provided an electronic system including a main board, a semiconductor device on the main board, and a controller electrically connected to the semiconductor device on the main board, wherein the semiconductor device includes a peripheral circuit disposed on a substrate, and a memory cell stack disposed on the peripheral circuit, wherein the memory cell stack disposed on the peripheral circuit includes a common source plate, a plurality of word lines spaced apart from each other in a first direction perpendicular to an upper surface of the substrate on the common source plate, a string select line disposed on the plurality of word lines, a plurality of memory strings extending in the first direction on the common source plate, wherein each memory string includes a first channel extending in the first direction through the plurality of word lines and a second channel extending in the first direction through the string select line, a plurality of bit lines electrically connected to the plurality of memory strings, and a strapping line connected to the string select line.

BRIEF DESCRIPTION OF THE DRAWINGS

Various embodiments will be more clearly understood from the following detailed description taken in conjunction with the accompanying drawings, in which:

FIGS. 11 to 19 are layout views illustrating semiconductor devices according to various embodiments;

DETAILED DESCRIPTION

Hereinafter, various embodiments will be described in detail with reference to the accompanying drawings.

Figure 1:
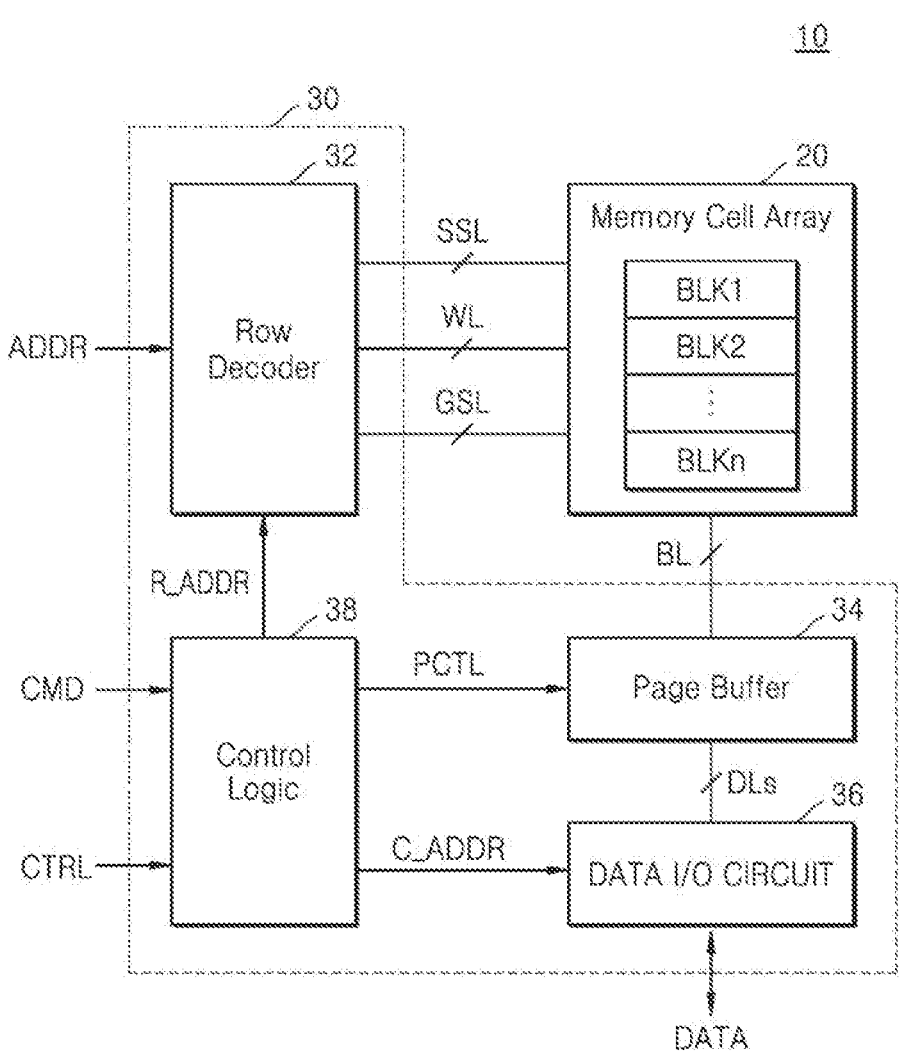
FIG. 1 is a block diagram of a semiconductor device according to some embodiments.

FIG. 1 is a block diagram of a semiconductor device 10 according to some embodiments.

Referring to FIG. 1, the semiconductor device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The memory cell blocks BLK1, BLK2, . . . , BLKn may be connected to the peripheral circuit 30 through a plurality of bit lines BL, a plurality of word lines WL, string select lines SSL, and ground select lines GSL.

The peripheral circuit 30 may include a row decoder 32, a page buffer 34, a data input/output (I/O) circuit 36, and a control logic 38. Although not shown in FIG. 1, the peripheral circuit 30 may further include an I/O interface, column logic, a voltage generator, a pre-decoder, a temperature sensor, a command decoder, an address decoder, an amplifier circuit, and the like.

The memory cell array 20 may be connected to the page buffer 34 through the bit lines BL, and may be connected to the row decoder 32 through the word lines WL, the string select lines SSL, and the ground select lines GSL. In the memory cell array 20, each of the plurality of memory cells included in the plurality of memory cell blocks BLK1, BLK2, . . . , BLKn may be a flash memory cell. The memory cell array 20 may include a three-dimensional memory cell array. The three-dimensional memory cell array may include a plurality of NAND strings, and each NAND string may include a plurality of memory cells respectively connected to the plurality of word lines WL stacked vertically on a substrate.

The peripheral circuit 30 may receive an address ADDR, a command CMD, and a control signal CTRL from the outside of the semiconductor device 10, and may transmit/receive data DATA to and from an external device of the semiconductor device 10.

The row decoder 32 may select at least one of the plurality of memory cell blocks BLK1, BLK2, . . . , BLKn in response to an address ADDR from the outside, and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense data DATA stored in the memory cell array 20. The page buffer 34 may operate according to a control signal PCTL provided from the control logic 38.

The data I/O circuit 36 may be connected to the page buffer 34 through data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust the voltage level provided to the word line WL and the bit line BL when a memory operation, such as a program operation or an erase operation, is performed.

Figure 2:
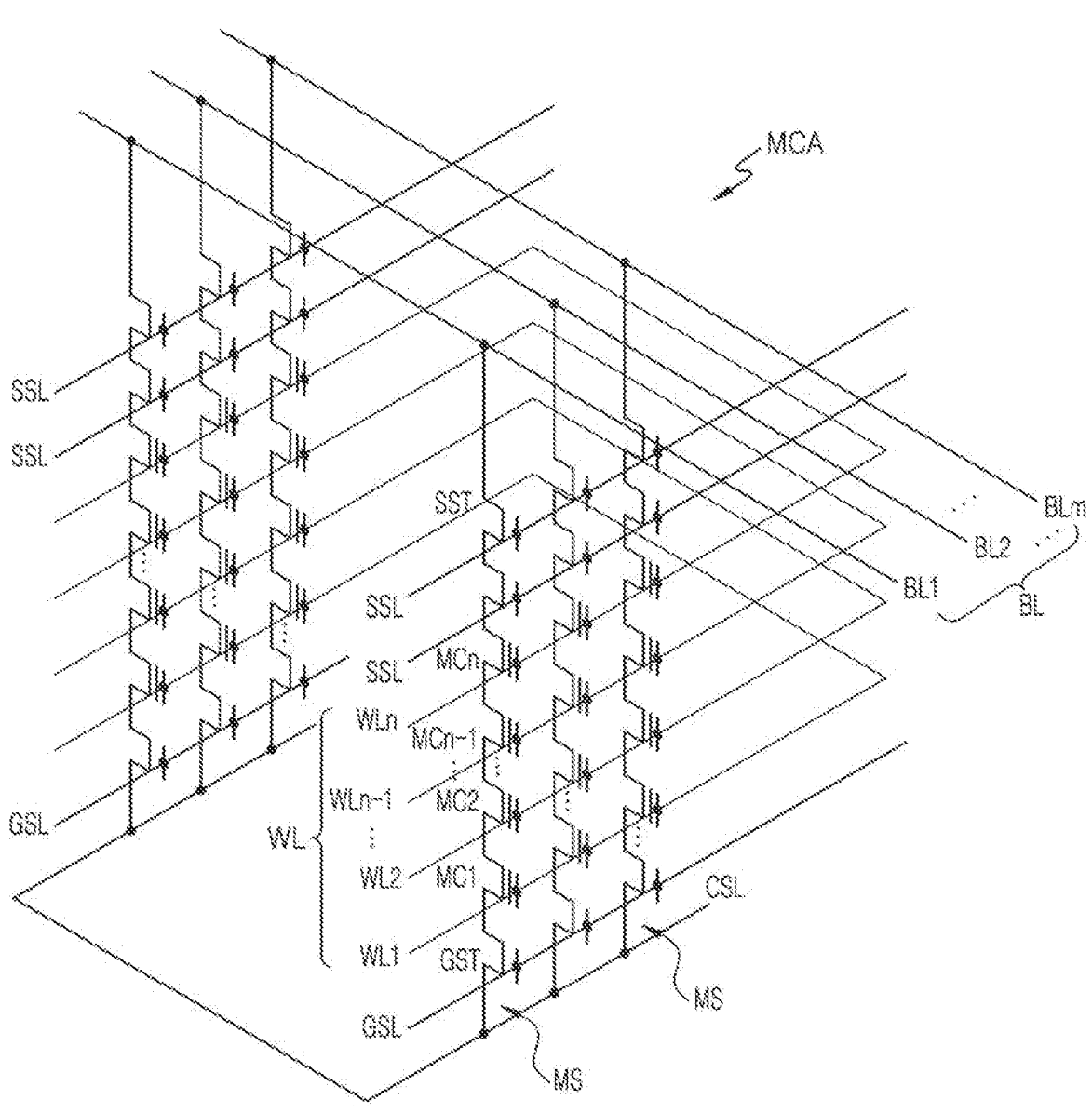
FIG. 2 is an equivalent circuit diagram of a memory cell array of the semiconductor device according to some embodiments.

FIG. 2 is an equivalent circuit diagram of a memory cell array of the semiconductor device 10 according to some embodiments.

Referring to FIG. 2, the memory cell array MCA may include a plurality of memory strings MS. The memory cell array MCA includes a plurality of bit lines BL: BL1, BL2, . . . , BLm, a plurality of word lines WL: WL1, WL2, . . . , WLn−1, WLn, at least one string select line SSL, at least one ground select line GSL, and a common source line CSL. A plurality of memory strings MS may be formed between the plurality of bit lines BL1, BL2, . . . , BLm and the common source line CSL. FIG. 2 illustrates a case where the plurality of memory strings MS each include two string select lines SSL, but embodiments are not limited thereto. For example, each of the plurality of memory strings MS may include one string select line SSL.

Each of the plurality of memory strings MS may include a string select transistor SST, a ground select transistor GST, and a plurality of memory cell transistors MC1, MC2, . . . , MCn−1, MCn. A drain region of the string select transistor SST may be connected to bit lines BL1, BL2, . . . , BLm, and a source region of the ground select transistor GST may be connected to a common source line CSL. The common source line CSL may be a region in which the source regions of the plurality of ground select transistors GST are commonly connected.

The string select transistor SST may be connected to the string select line SSL, and the ground select transistor GST may be connected to the ground select line GSL. The plurality of memory cell transistors MC1, MC2, . . . , MCn−1, and MCn may be respectively connected to a plurality of word lines WL: WL1, WL2, . . . , WLn−1, WLn.

Figure 3:
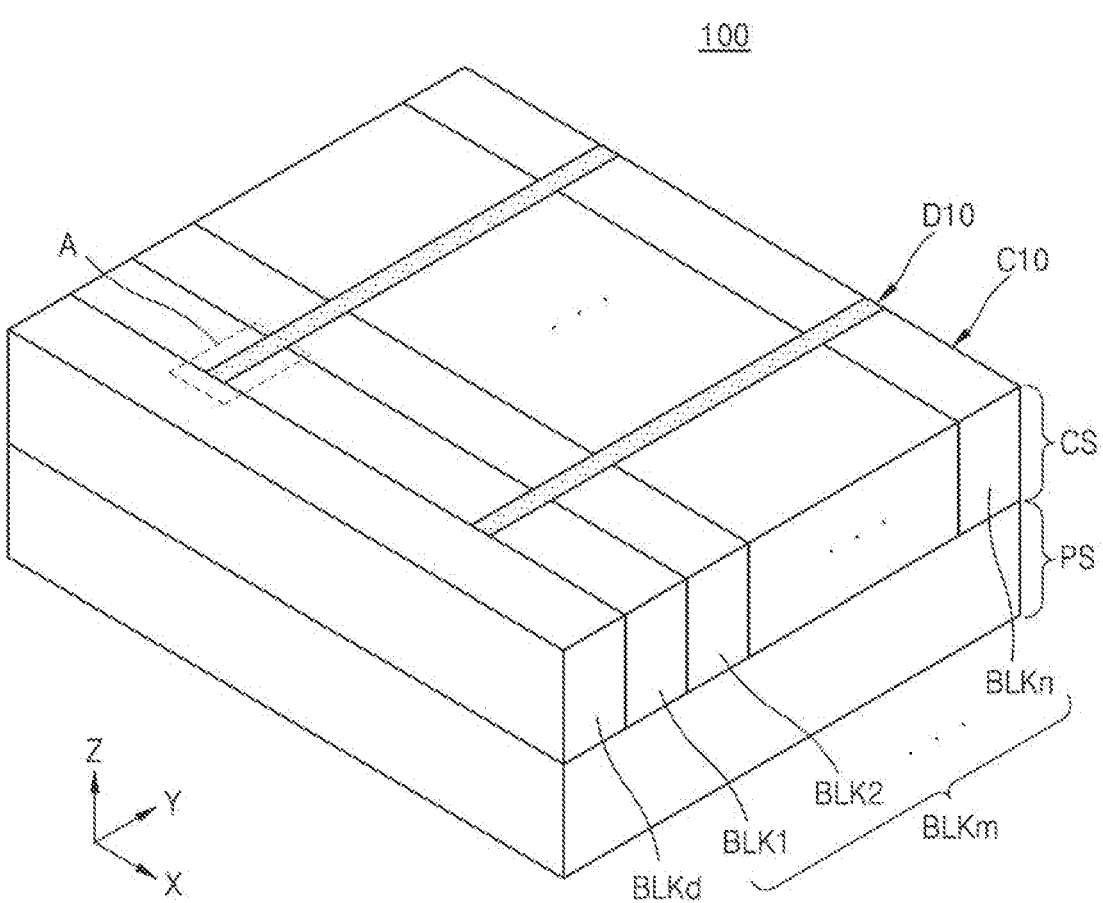
FIG. 3 is a schematic perspective view illustrating a semiconductor device according to some embodiments.

FIG. 3 is a schematic perspective view illustrating a semiconductor device 100 according to some embodiments.

Referring to FIG. 3, the semiconductor device 100 may include a peripheral circuit stack PS and a memory cell stack CS disposed on the peripheral circuit stack PS. The peripheral circuit stack PS may include the peripheral circuit 30 described with reference to FIG. 1, and the memory cell stack CS may include the memory cell array 20 described with reference to FIG. 1.

The memory cell stack CS includes a plurality of cell blocks, and the plurality of cell blocks may include a plurality of main blocks BLKm and at least one dummy block BLKd disposed on at least one side of the plurality of main blocks BLKm. The plurality of main blocks BLKm may include the plurality of memory cell blocks BLK1, BLK2, . . . , BLKn described with reference to FIG. 1. For example, each of the plurality of memory cell blocks BLK1, BLK2, . . . , BLKn may include three-dimensionally arranged memory cells, and each of the plurality of memory cell blocks BLK1, BLK2, . . . , BLKn may include a memory cell area C10 and a dummy memory cell area D10 that have a preset width and are alternately repeated. As described below with reference to FIG. 4, the dummy memory cell area D10 may be an area where a strapping line SSL (see FIG. 4) or a shunt structure electrically connected to memory cells arranged in the memory cell area C10 is disposed.

In example embodiments, the memory cell stack CS may be disposed at a higher vertical level than the peripheral circuit stack PS. In some embodiments, a peripheral circuit stack PS may be first formed on one substrate, and then a memory cell stack CS may be formed on the peripheral circuit stack PS. In some embodiments, the peripheral circuit stack PS may be formed on a first substrate, the memory cell stack CS may be formed on a second substrate, and the peripheral circuit stack PS and the memory cell stack CS may be attached to each other by bonding.

Figure 4:
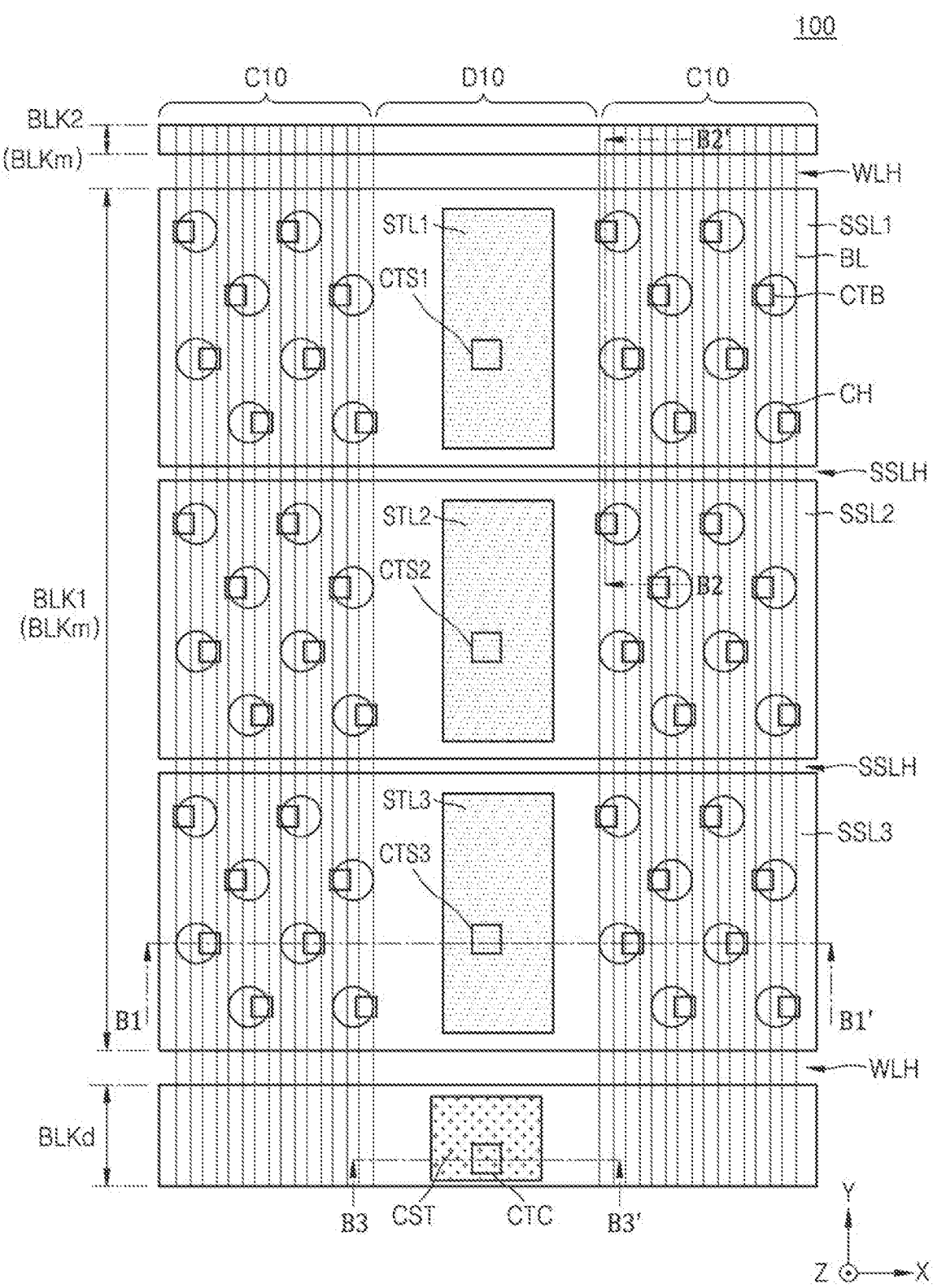
FIG. 4 is a layout diagram illustrating a semiconductor device according to some embodiments.

FIG. 4 is a layout diagram illustrating a semiconductor device 100 according to some embodiments. FIG. 4 is an enlarged layout diagram of a portion A of FIG. 3.

Referring to FIG. 4, each of a plurality of memory cell blocks BLK1, BLK2, . . . , BLKn included in the main block BLKm (see FIG. 3) may be defined between two adjacent stack separation regions WLH in the second horizontal direction Y. For example, as shown in FIG. 4, a first memory cell block BLK1 may be defined between two adjacent stack separation regions WLH in the second horizontal direction Y, and a width of the first memory cell block BLK1 in the second horizontal direction Y may correspond to a distance between two adjacent stack separation regions WLH. The first memory cell block BLK1 and the adjacent second memory cell block BLK2 may be electrically separated from each other by the stack separation region WLH.

In example embodiments, the first memory cell block BLK1 may include a first string select line SSL1, a second string select line SSL2, and a third string select line SSL3. The first string select line SSL1, the second string select line SSL2, and the third string select line SSL3 may be disposed spaced apart from each other in the second horizontal direction Y. A string separation region SSLH extending in a first horizontal direction X may be disposed between the first string select line SSL1 and the second string select line SSL2, and a string separation region SSLH extending in the first horizontal direction X may be disposed between the second string select line SSL2 and the third string select line SSL3.

Although the structure in which the first memory cell block BLK1 includes the first to third string select lines SSL1, SSL2, and SSL3 has been described as an example with reference to FIG. 4, in some embodiments, the first memory cell block BLK1 may include one, two, or four or more string select lines.

A plurality of channel structures CH may be disposed in the memory cell area C10 of the main block BLKm, and bit lines BL electrically connected to the plurality of channel structures CH may be disposed. For example, the plurality of channel structures CH may be arranged spaced apart from each other at preset intervals in the first horizontal direction X, the second horizontal direction Y, and the third horizontal direction (e.g., diagonal direction). In some embodiments, the plurality of channel structures CH may be arranged in a zigzag shape or staggered shape. The plurality of bit lines BL may be arranged to extend in the second horizontal direction Y. The plurality of bit lines BL may be electrically connected to the plurality of channel structures CH through bit line contacts CTB.

A first strapping line STL1, a second strapping line STL2, and a third strapping line STL3 may be disposed in the dummy memory cell area D10 of the main block BLKm. The first to third strapping lines STL1, STL2, and STL3 may be arranged to vertically overlap the first to third string select lines SSL1, SSL2, and SSL3, respectively. For example, the first strapping line STL1 may be electrically connected to the first string select line SSL1 through a first strapping contact CTS1, the second strapping line STL2 may be electrically connected to the second string select line SSL2 through a second strapping contact CTS2, and the third strapping line STL3 may be electrically connected to the third string select line SSL3 through a third strapping contact CTS3.

The first to third strapping lines STL1, STL2, and STL3 may function as bypass wires or shunt structures electrically connected to the first to third string select lines SSL1, SSL2, and SSL3. Since the first to third strapping lines STL1, STL2, and STL3 are electrically connected to the first to third string select lines SSL1, SSL2, and SSL3, resistance of the first to third string select lines SSL1, SSL2, and SSL3 may decrease.

In the dummy block BLKd, a common source tapping line CST may be disposed at a position corresponding to the dummy memory cell area D10. In some embodiments, the common source tapping line CST may be disposed in the dummy memory cell area D10. The common source tapping line CST may be electrically connected to the common source plate 150 (see FIG. 5) through the common source contact CTC.

In the embodiment shown in FIG. 4, the common source tapping line CST may be disposed at a position corresponding to the first to third strapping lines STL1, STL2, and STL3 in the second horizontal direction Y. For example, the common source tapping line CST may be positioned in a straight line with the first to third strapping lines STL1, STL2, and STL3 in the second horizontal direction Y.

According to the above embodiments, in the dummy memory cell area D10 where the common source tapping line CST is disposed, first to third strapping lines STL1, STL2, and STL3 electrically connected to the first to third string select lines SSL1, SSL2, and SSL3 may be disposed. Accordingly, for example, even when the first to third string select lines SSL1, SSL2, and SSL3 include a material having a relatively low resistivity, such as polysilicon, because the first to third strapping lines STL1, STL2, and STL3 function as bypass wires or shunt structures for the first to third string select lines SSL1, SSL2, and SSL3, a wiring resistance of the first to third string select lines SSL1, SSL2, and SSL3 may be reduced. Accordingly, the semiconductor device 100 may have excellent performance.

Figure 5:
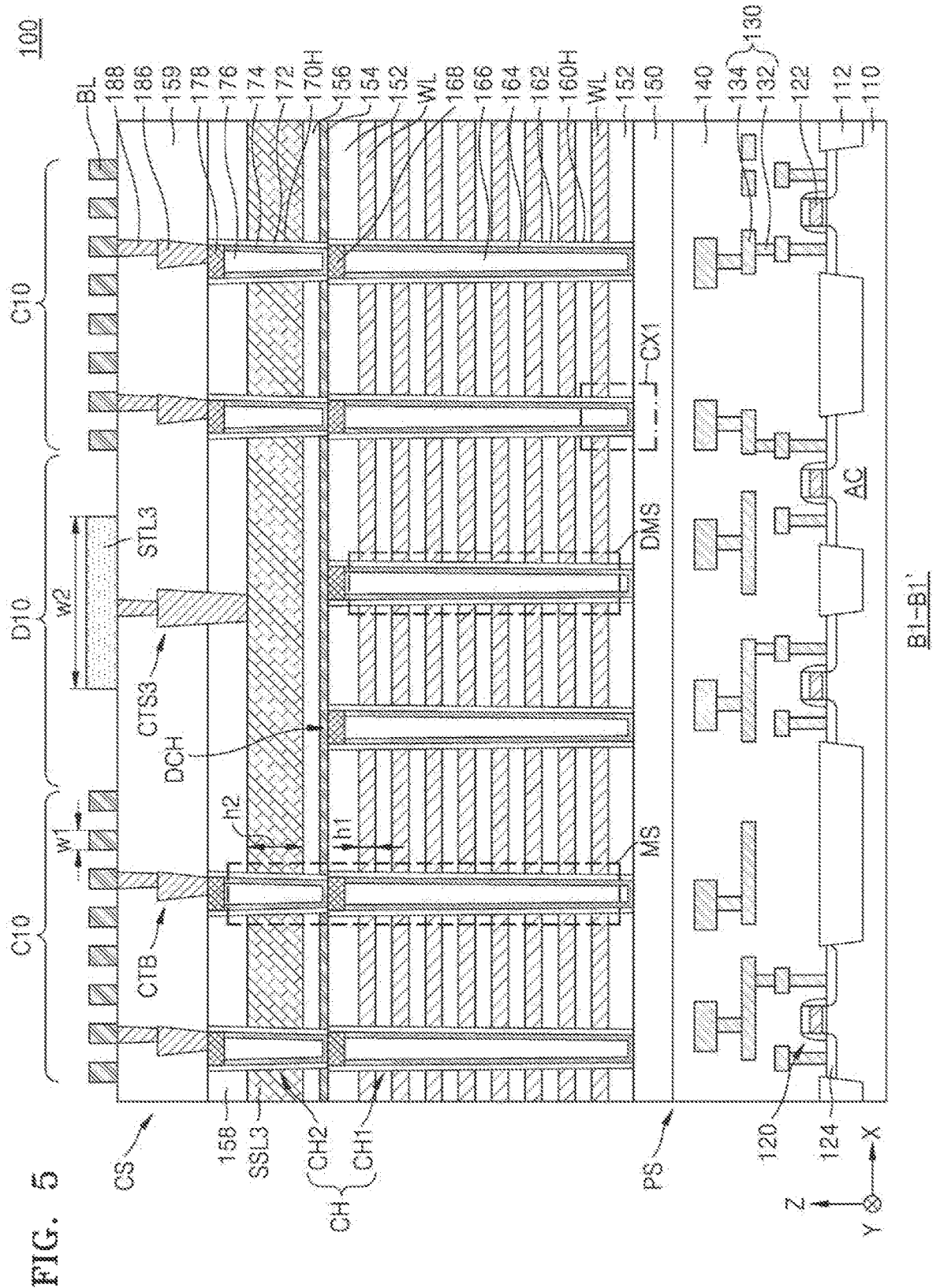
FIGS. 5 to 7 are cross-sectional views illustrating a semiconductor device according to some embodiments.
Figure 6:
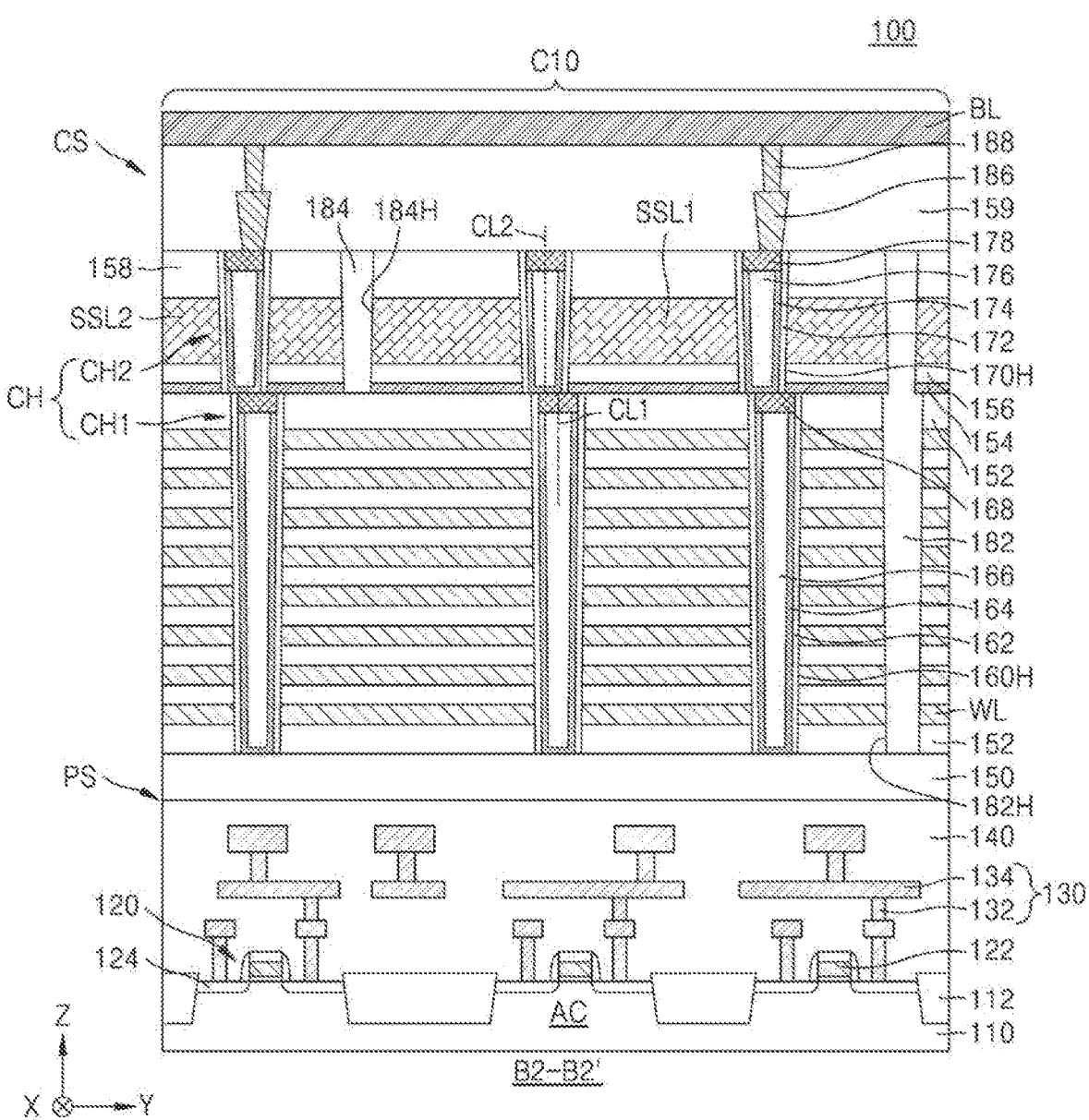
Figure 7:
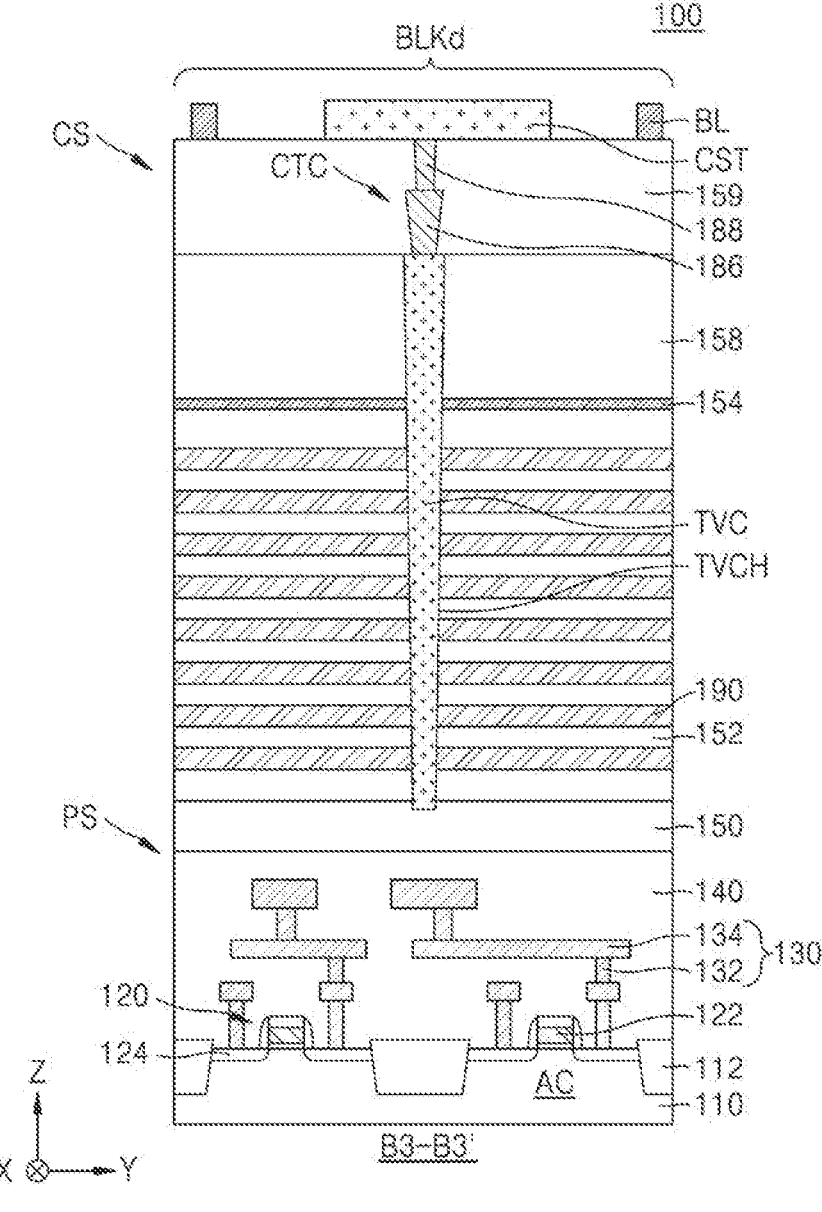

FIGS. 5 to 7 are cross-sectional views illustrating the semiconductor device 100 according to some embodiments. Specifically, FIG. 5 is a cross-sectional view taken along line B1-B1' in FIG. 4, FIG. 6 is a cross-sectional view taken along line B2-B2' in FIG. 4, and FIG. 7 is a cross-sectional view taken along line B3-B3' in FIG. 4.

Referring to FIGS. 5 to 7, a peripheral circuit 120 may be disposed on a substrate 110. A wiring structure 130 electrically connected to the peripheral circuit 120 may be disposed on the substrate 110, and a peripheral circuit insulating layer 140 covering the peripheral circuit 120 and the wiring structure 130 may be disposed on the substrate 110.

In example embodiments, the substrate 110 may include a semiconductor material, such as a group IV semiconductor, a group III-V compound semiconductor, or a group II-VI oxide semiconductor. For example, the group IV semiconductor may include silicon (Si), germanium (Ge), or silicon-germanium. The substrate 110 may be provided as a bulk wafer or as an epitaxial layer. In another embodiment, the substrate 110 may include a silicon-on-insulator (SOI) substrate or a germanium-on-insulator (GeOI) substrate.

In the substrate 110, an active region AC may be defined by an element isolation film 112, and a plurality of peripheral circuits 120 may be formed on the active region AC. The plurality of peripheral circuits 120 may include a peripheral circuit gate 122 and source/drain regions 124 disposed on portions of the substrate 110 on both sides of the peripheral circuit gate 122.

The wiring structure 130 may include a peripheral circuit contact 132 and a peripheral circuit wiring layer 134. The peripheral circuit insulating layer 140 may cover the peripheral circuit 120 and the wiring structure 130 on the substrate 110. In example embodiments, the peripheral circuit insulating layer 140 may include an insulating material that may include silicon oxide, silicon nitride, a low-k dielectric material, or a combination thereof. The low-k dielectric material is a material having a dielectric constant lower than silicon oxide, and for example, may include phosphosilicate glass (PSG), borophosphosilicate glass (BPSG), fluorosilicate glass (FSG), organosilicate glass (OSG), spin-on-glass (SOG), spin-on-polymer, or a combination thereof.

A common source plate 150 may be disposed on the peripheral circuit insulating layer 140. The common source plate 150 may function as a source region supplying current to memory cells formed on the common source plate 150. In embodiments, the common source plate 150 may include at least one of silicon (Si), germanium (Ge), silicon germanium (SiGe), gallium arsenide (GaAs), indium gallium arsenide (InGaAs), aluminum gallium arsenide (AlGaAs), and mixtures thereof. In some embodiments, the common source plate 150 may include a semiconductor doped with an n-type impurity. In some embodiments, the common source plate 150 may have a single crystal structure, an amorphous crystal structure, or a polycrystalline crystal structure. In some examples, the common source plate 150 may include polysilicon doped with n-type impurities.

A plurality of word lines WL may be spaced apart from each other in the vertical direction Z on the common source plate 150. The plurality of word lines WL may be alternately disposed with a plurality of insulating layers 152. A string select line SSL may be disposed on the plurality of word lines WL. The string select line SSL may be spaced apart from the uppermost word line WL in the vertical direction Z. For example, an etch stop film 154 may be disposed on the uppermost insulating layer 152 disposed on the uppermost word line WL, a lower insulating layer 156 may be disposed on the etch stop film 154, a string select line SSL may be disposed on the lower insulating layer 156, and an upper insulating layer 158 may be disposed on the string select line SSL. While the third string select line SSL3 is illustrated in FIG. 5, the other string select lines SSL may have a similar configuration to the third string select line SSL3 shown in FIG. 4.

In example embodiments, the string select line SSL may have a second height h2 in the vertical direction Z that is greater than the first height h1 in the vertical direction Z of the word line WL. The string select line SSL may include a metal, such as tungsten, nickel, cobalt, tantalum, and the like, a metal silicide, such as tungsten silicide, nickel silicide, cobalt silicide, tantalum silicide, and the like, a metal nitride, such as tungsten nitride, titanium nitride, tantalum nitride, and the like, doped polysilicon, or combinations thereof. In some examples, the string select line SSL may include doped polysilicon. In embodiments, the string select line SSL may include a material that is different from a material constituting the plurality of word lines WL, and may be formed in a process separate from a process of forming the plurality of word lines WL, but embodiments are not limited thereto.

Each of a plurality of channel structures CH may include a first channel CH1 and a second channel CH2 connected to the first channel CH1. The first channel CH1 may extend in the vertical direction Z through the plurality of word lines WL, and the second channel CH2 may extend in the vertical direction Z through the string select line SSL. The second channel CH2 may be electrically connected to the first channel CH1.

The plurality of word lines WL and the first channel CH1 penetrating the plurality of word lines WL may constitute a plurality of memory cells MC1, MC2, . . . , MCn–1, MCn in FIG. 2, and the string select line SSL and the second channel CH2 penetrating the string select line SSL may constitute the string select transistor SST in FIG. 2. A plurality of memory cells MC constituted by one first channel CH1 and a string select transistor SST constituted by one second channel CH2 may form one memory string MS (see FIG. 2). In some embodiments, the lowermost several word lines WL disposed adjacent to the common source plate 150 may function as a ground select line GSL (see FIG. 2) and/or a dummy word line.

The first channel CH1 may include a first gate insulating layer 162, a first channel layer 164, a first filling insulating layer 166, and a first conductive plug 168 disposed in a first channel hole 160H. The first channel hole 160H may extend in the vertical direction Z through the plurality of word lines WL and the plurality of insulating layers 152, the first gate insulating layer 162 may be disposed on the sidewall of the first channel hole 160H, and the first channel layer 164 may be disposed on the first gate insulating layer 162 in the first channel hole 160H and connected to the common source plate 150. The first filling insulating layer 166 may fill the first channel hole 160H on the first channel layer 164, and the first conductive plug 168 may be disposed above the first channel hole 160H and electrically connected to the first channel layer 164.

The second channel CH2 may include a second gate insulating layer 172, a second channel layer 174, a second filling insulating layer 176, and a second conductive plug 178 disposed in the second channel hole 170H. The second channel hole 170H may extend in a vertical direction Z through the etch stop film 154, the lower insulating layer 156, the string select line SSL, and the upper insulating layer 158, and a bottom portion of the second channel hole 170H may expose an upper surface of the first channel CH1 (e.g., an upper surface of the first conductive plug 168). The second gate insulating layer 172 may be disposed on the sidewall of the second channel hole 170H, and the second channel layer 174 may be disposed on the second gate insulating layer 172 in the second channel hole 170H and connected to the first conductive plug 168. The second filling insulating layer 176 may fill the second channel hole 170H on the second channel layer 174, and the second conductive plug 178 may be disposed above the first channel hole 170H and electrically connected to the second channel layer 174.

In embodiments, a first channel CH1 is formed in the first channel hole 160H, and then, after forming the etch stop film 154, the lower insulating layer 156, the string select line SSL, and the upper insulating layer 158, a second channel hole 170H passing through the etch stop film 154, the lower insulating layer 156, the string select line SSL, and the upper insulating layer 158 may be formed, and a second channel CH2 may be formed in the second channel hole 170H.

In some embodiments, in the case of at least one channel structure CH among a plurality of channel structures CH, as shown in FIG. 6, the center line CL2 of the second channel CH2 may be offset or spaced apart from the center line CL1 of the first channel CH1 in a horizontal direction (e.g., the second horizontal direction Y).

A dummy memory string DMS passing through the word line WL may be disposed in the dummy memory cell area D10. The dummy memory string DMS may include a dummy channel structure DCH and a portion of a word line WL around the dummy channel structure DCH. The dummy memory string DMS may be disposed at a position vertically overlapping the strapping line STL.

In example embodiments, each of the plurality of dummy channel structures DCH may be disposed in a dummy memory cell area D10, and may extend in the vertical direction Z through the plurality of word lines WL and the plurality of insulating layers 152. For example, an upper surface of each of the plurality of dummy channel structures DCH may contact a bottom surface of the etch stop film 154. For example, each of the plurality of dummy channel structures DCH may have a structure and shape similar to those of the first channel CH1 of the plurality of channel structures CH. For example, the plurality of dummy channel structures DCH may be formed in the same process as the first channel CH1 of the plurality of channel structures CH.

In example embodiments, a structure corresponding to the second channel CH2 of the plurality of channel structures CH may not be formed on the plurality of dummy channel structures DCH. Accordingly, the dummy memory string DMS may not include a string select transistor.

A part of the string select line SSL disposed in the dummy memory cell area D10 may have a flat shape over the entire area, and for example, a channel hole may not be formed in a portion of a string select line SSL disposed in the dummy memory cell area D10. The plurality of dummy channel structures DCH may be arranged to vertically overlap the string select line SSL.

A stack isolation insulating layer 182 may be disposed in the plurality of stack isolation openings 182H extending in the first horizontal direction X through the plurality of word lines WL and the plurality of insulating layers 152. The stack isolation opening 182H may be formed at a position corresponding to the stack separation region WLH shown in FIG. 4. The stack isolation insulating layer 182 may include a silicon oxide layer, a silicon nitride layer, SiON, SiOCN, SiCN, or a combination thereof.

A string isolation insulating layer 184 may be disposed in a plurality of string isolation openings 184H extending in the first horizontal direction X through the upper insulating layer 158, the string select line SSL, and the lower insulating layer 156. The string isolation opening 184H may be formed at a position corresponding to the string separation region SSLH shown in FIG. 4. The string isolation insulating layer 184 may include a silicon oxide layer, a silicon nitride layer, SiON, SiOCN, SiCN, or a combination thereof.

An interlayer insulating film 159 may be disposed on the upper insulating layer 158, and a first contact 186 and a second contact 188 passing through the interlayer insulating layer 159 may be disposed. The first contact 186 and the second contact 188 may be stud-type conductive layers. For example, the bit line contact CTB may include a first contact 186 and a second contact 188, and a bottom surface of the first contact 186 may be connected to the second channel CH2, and a bottom surface of the second contact 188 may be connected to a top surface of the first contact 186. The strapping contact CTS may include a first contact 186 and a second contact 188. As shown in FIG. 5, the first contact 186 included in the strapping contact CTS may extend to a lower vertical level than the first contact 186 included in the bit line contact CTB, and a bottom surface of the first contact 186 included in the strapping contact CTS may be connected to the string select line SSL.

The strapping line STL may be disposed on the first interlayer insulating film 159 to be connected to the strapping contact CTS. The bit line BL may be disposed to be connected to the bit line contact CTB on the first interlayer insulating film 159. The bit line BL may have a first width w1 in the first horizontal direction X, and the strapping line STL may have a second width w2 that is greater than the first width w1 in the first horizontal direction X.

As shown in FIG. 7, a plurality of insulating layers 152 and a plurality of mold layers 190 may be alternately disposed on the common source plate 150 in the dummy block BLKd. Each of the plurality of mold layers 190 may be disposed on the same vertical level as the plurality of word lines WL. For example, the mold layer 190 may include silicon nitride.

In the dummy block BLKd, through holes TVCH extending in the vertical direction Z through the plurality of insulating layers 152 and the plurality of mold layers 190 may be disposed and a through via TVC may be disposed in the through hole TVCH. A bottom portion of the through-via TVC may be connected to an upper surface of the common source plate 150, and an upper surface of the through via TVC may be connected to the common source contact CTC. Accordingly, an electrical path may be formed from the common source plate 150 to the common source tapping line CST through the through via TVC and the common source contact CTC.

Although an embodiment in which the channel structure CH has a structure including a first channel CH1 passing through a plurality of word lines WL and a second channel CH2 passing through a string select line SSL has been shown in FIGS. 5 to 7, in some embodiments, a channel structure may be disposed in one channel hole which passes through a plurality of word lines WL and string select lines SSL. In this case, the string select line SSL may have the same thickness as the thickness of the plurality of word lines WL in the vertical direction Z.

Figure 8:
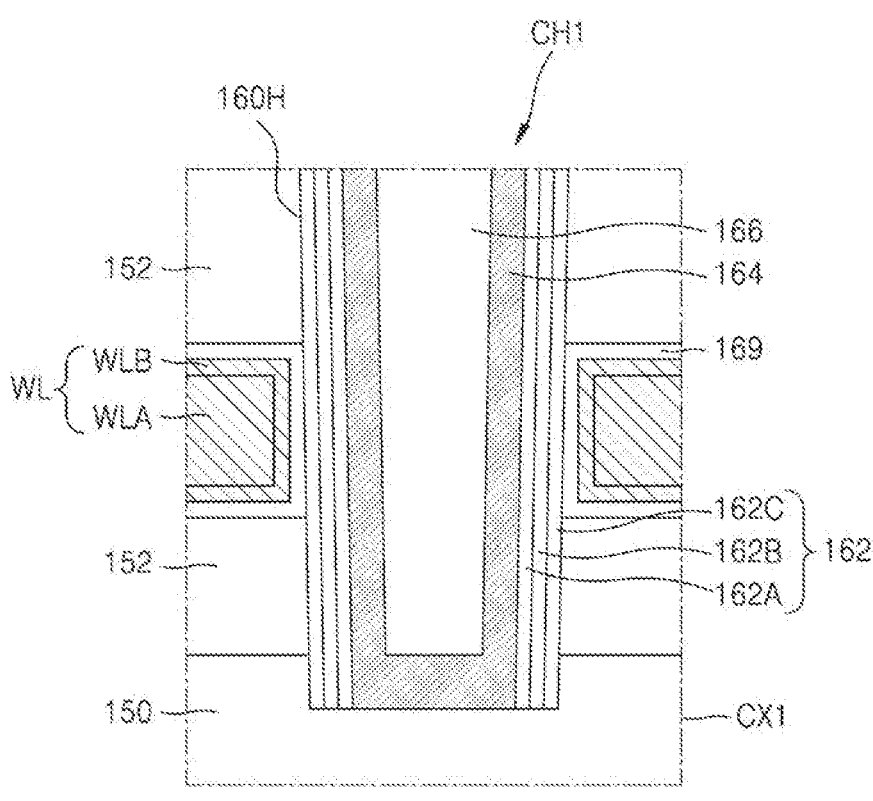
FIGS. 8 to 10 are enlarged cross-sectional views illustrating a first channel according to various embodiments.
Figure 9:
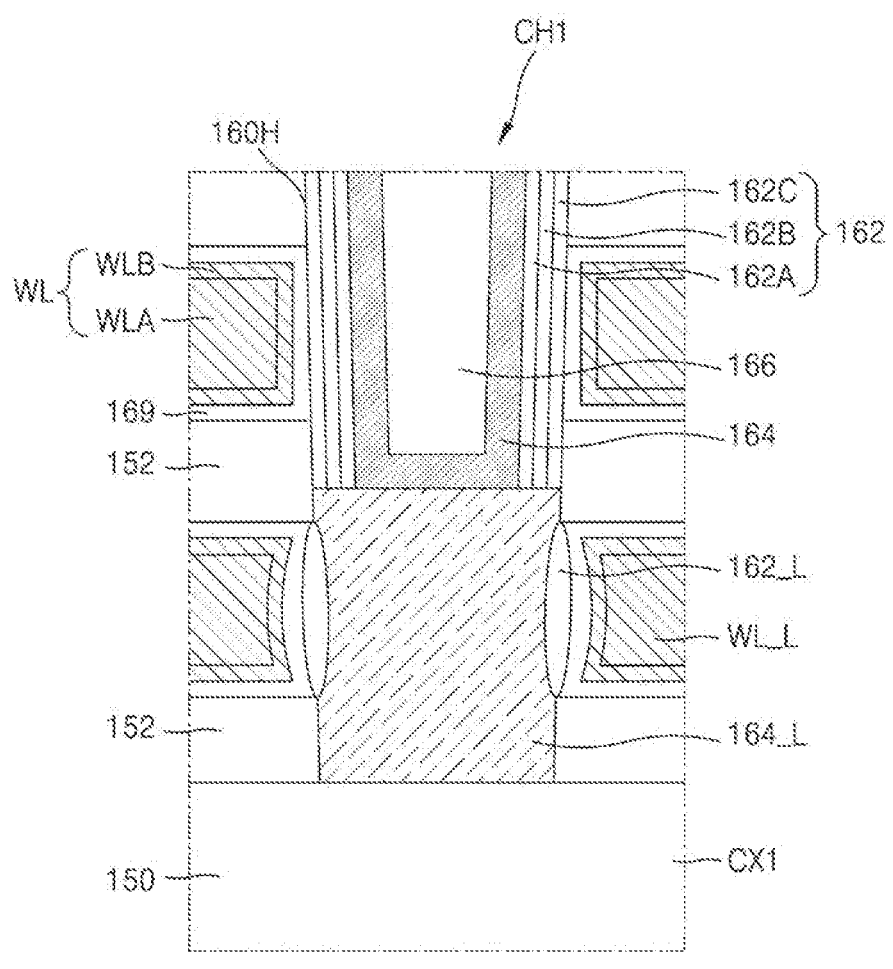
Figure 10:
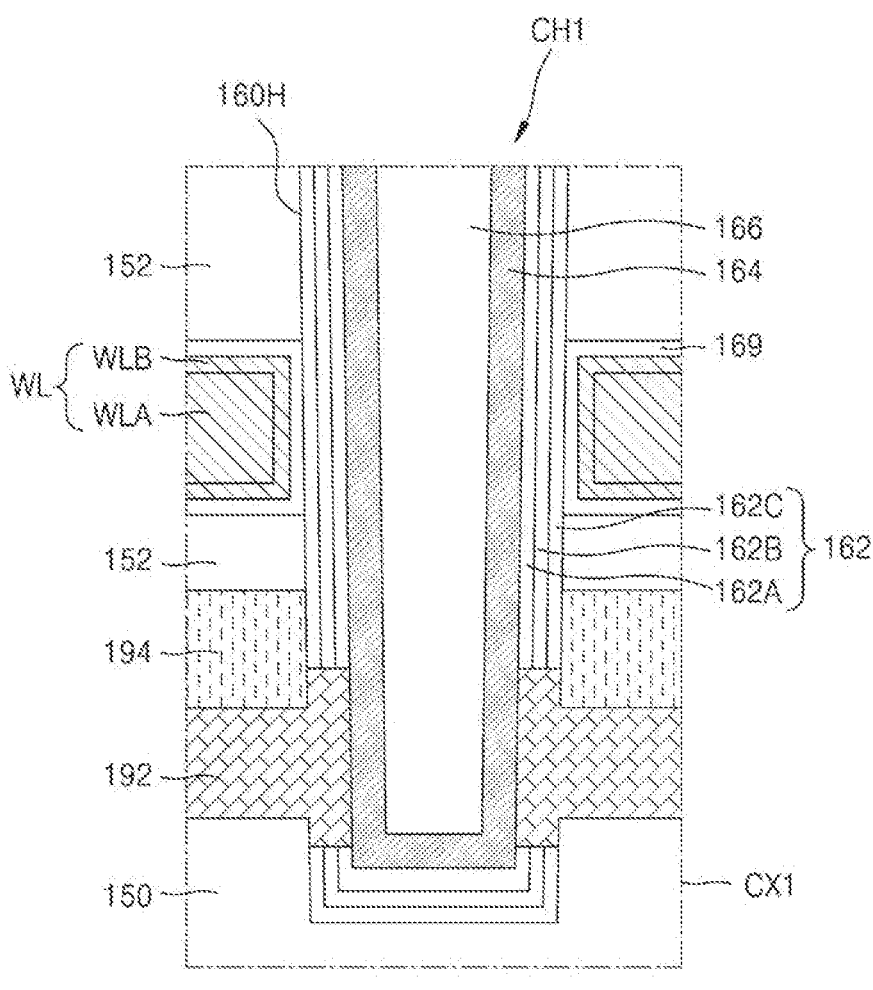

FIGS. 8 to 10 are enlarged cross-sectional views illustrating a first channel CH1 according to various embodiments. FIGS. 8 to 10 are enlarged views of portions corresponding to CX1 of FIG. 5.

Referring to FIG. 8, the word line WL may include a buried conductive layer WLA and a conductive bather layer WLB surrounding top, bottom, and side surfaces of the buried conductive layer WLA. For example, the buried conductive layer WLA may include a metal, such as tungsten, nickel, cobalt, tantalum, and the like, a metal silicide, such as tungsten silicide, nickel silicide, cobalt silicide, tantalum silicide, and the like, doped polysilicon, or a combination thereof. In some embodiments, the conductive barrier layer WLB may include titanium nitride, tantalum nitride, tungsten nitride, or a combination thereof. In example embodiments, a dielectric liner 169 may be further disposed between the conductive barrier layer WLB and the insulating layer 152, and the dielectric liner 169 may include a high-k dielectric material, such as aluminum oxide.

The first gate insulating layer 162 may have a structure including a tunneling dielectric film 162A, a charge storage film 162B, and a blocking dielectric film 162C sequentially on the outer wall of the first channel layer 164. Relative thicknesses of the tunneling dielectric film 162A, the charge storage film 162B, and the blocking dielectric film 162C constituting the first gate insulating layer 162 are not limited to those illustrated in FIG. 8 and may be variously modified.

The tunneling dielectric film 162A may include silicon oxide, hafnium oxide, aluminum oxide, zirconium oxide, tantalum oxide, or the like. The charge storage film 162B is a region in which electrons passing through the tunneling dielectric film 162A from the first channel layer 164 may be stored and may include silicon nitride, boron nitride, silicon boron nitride, or polysilicon doped with impurities. The blocking dielectric film 162C may be formed of silicon oxide, silicon nitride, or metal oxide having a higher dielectric constant than silicon oxide. The metal oxide may be formed of hafnium oxide, aluminum oxide, zirconium oxide, tantalum oxide, or a combination thereof.

Referring to FIG. 9, the first channel CH1 includes a first gate insulating layer 162, a first channel layer 164, a first filling insulating layer 166, and a first conductive plug 168, and may further include a contact semiconductor layer 164_L and a bottom insulating layer 162_L disposed on the bottom portion of the channel hole 160H. The first channel layer 164 does not directly contact the common source plate 150, and the first channel layer 164 may be electrically connected to the common source plate 150 through the contact semiconductor layer 164_L. In embodiments, the contact semiconductor layer 164_L may include a silicon layer formed by a selective epitaxy growth (SEG) process using the common source plate 150 disposed on the bottom portion of the channel hole 160H as a seed layer.

A bottom insulating layer 162_L may be disposed between the lowermost word line WL_L and the contact semiconductor layer 164_L. In embodiments, the bottom insulating layer 162_L may include silicon oxide and, for example, may be formed by performing an oxidation process on a portion of a sidewall of the contact semiconductor layer 164_L.

Referring to FIG. 10, a horizontal semiconductor layer 192 and a support layer 194 may be sequentially stacked on an upper surface of the common source plate 150, and an insulating layer 152 may be disposed on the support layer 194.

In embodiments, the horizontal semiconductor layer 192 may include doped polysilicon or undoped polysilicon. The horizontal semiconductor layer 192 may function as a part of a common source region connecting the common source plate 150 and the first channel layer 164 to each other. For example, the support layer 194 may include doped or undoped polysilicon. The support layer 194 may serve as a support layer for preventing the mold stack from collapsing or leaning in a process of removing the sacrificial material layer (not shown) for forming the horizontal semiconductor layer 192.

The first channel CH1 may include a first gate insulating layer 162, a first channel layer 164, a first filling insulating layer 166, and a first conductive plug 168. As shown as an example in FIG. 10, a first gate insulating layer 162 may be disposed on an inner wall and a bottom portion of the channel hole 160H. The bottom surface of the first channel layer 164 is disposed on the first gate insulating layer 162 and does not directly contact the common source plate 150, and a sidewall of the bottom portion of the first channel layer 164 may be surrounded by the horizontal semiconductor layer 192.

FIGS. 11 to 19 are layout views illustrating semiconductor devices according to various embodiments.

Figure 11:
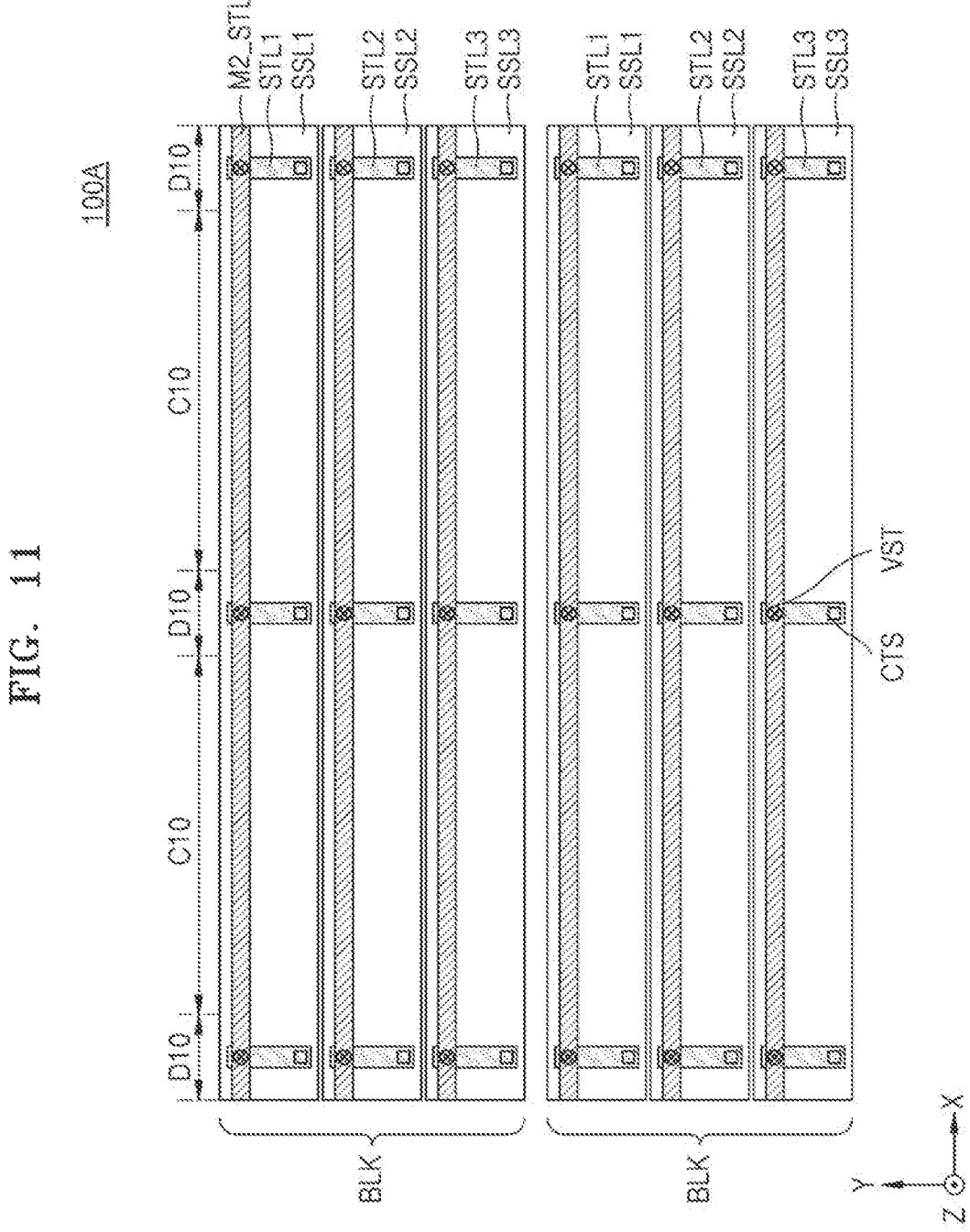

Referring to FIG. 11, in the semiconductor device 100A, one memory cell block BLK includes first to third string select lines SSL1, SSL2, and SSL3, and the first to third strapping lines STL1, STL2, and STL3 may be connected to the first to third string select lines SSL1, SSL2, and SSL3, respectively. The first to third strapping lines STL1, STL2, and STL3 may be electrically connected to the first to third string select lines SSL1, SSL2, and SSL3 through the strapping contact CTS.

The first to third strapping lines STL1, STL2, and STL3 may be electrically connected to the strapping wiring M2_STL. The strapping wiring M2_STL may extend in the first horizontal direction X at a vertical level that is different from that of the first to third strapping lines STL1, STL2, and STL3 (e.g., at a vertical level higher than a vertical level of the first to third strapping lines STL1, STL2, and STL3). For example, the first to third strapping lines STL1, STL2, and STL3 may be arranged at the same vertical level as the plurality of bit lines BL (see FIG. 5), and the strapping wiring M2_STL may be disposed at a higher vertical level than the plurality of bit lines BL. The strapping wiring M2_STL may be electrically connected to the first to third strapping lines STL1, STL2, and STL3 through the strapping via VST.

FIG. 11 shows as an example that the strapping wiring M2_STL is connected to each of the first to third strapping lines STL1, STL2, and STL3. Accordingly, three strapping wirings M2_STL may be disposed on one memory cell block BLK.

Figure 12:
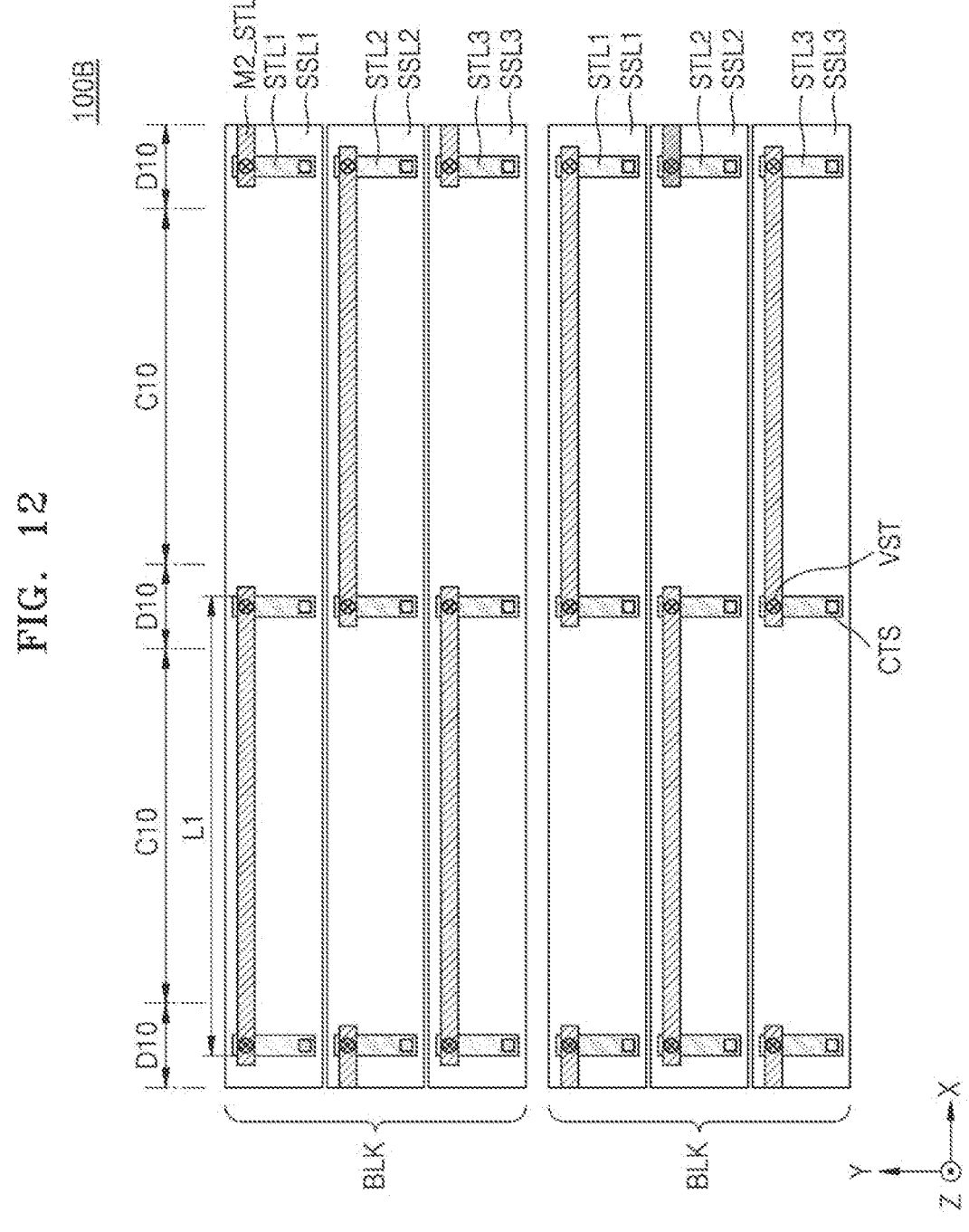

Referring to FIG. 12, in a semiconductor device 100B, the strapping wiring M2_STL having a total length corresponding to ½ of the total length of the strapping wiring M2_STL described with reference to FIG. 11 may be connected for each of the first to third strapping lines STL1, STL2, and STL3. For example, in one memory cell block BLK, a strapping wiring M2_STL having a first length L1 on the first string select line SSL1 may be disposed in every other memory cell area C10. For example, a strapping wiring M2_STL may be disposed in an even-numbered memory cell area C10 on one first string select line SSL1, or a strapping wiring M2_STL may be arranged in an odd-numbered memory cell area C10 on one first string select line SSL1.

For one memory cell area C10, a strapping wiring M2_STL may be disposed on the first string select line SSL1, a strapping wiring M2_STL is not disposed on the second string select line SSL2 adjacent to the first string select line SSL1, and a strapping wiring M2_STL may be disposed on the third string select line SSL3 adjacent to the second string select line SSL2.

Figure 13:
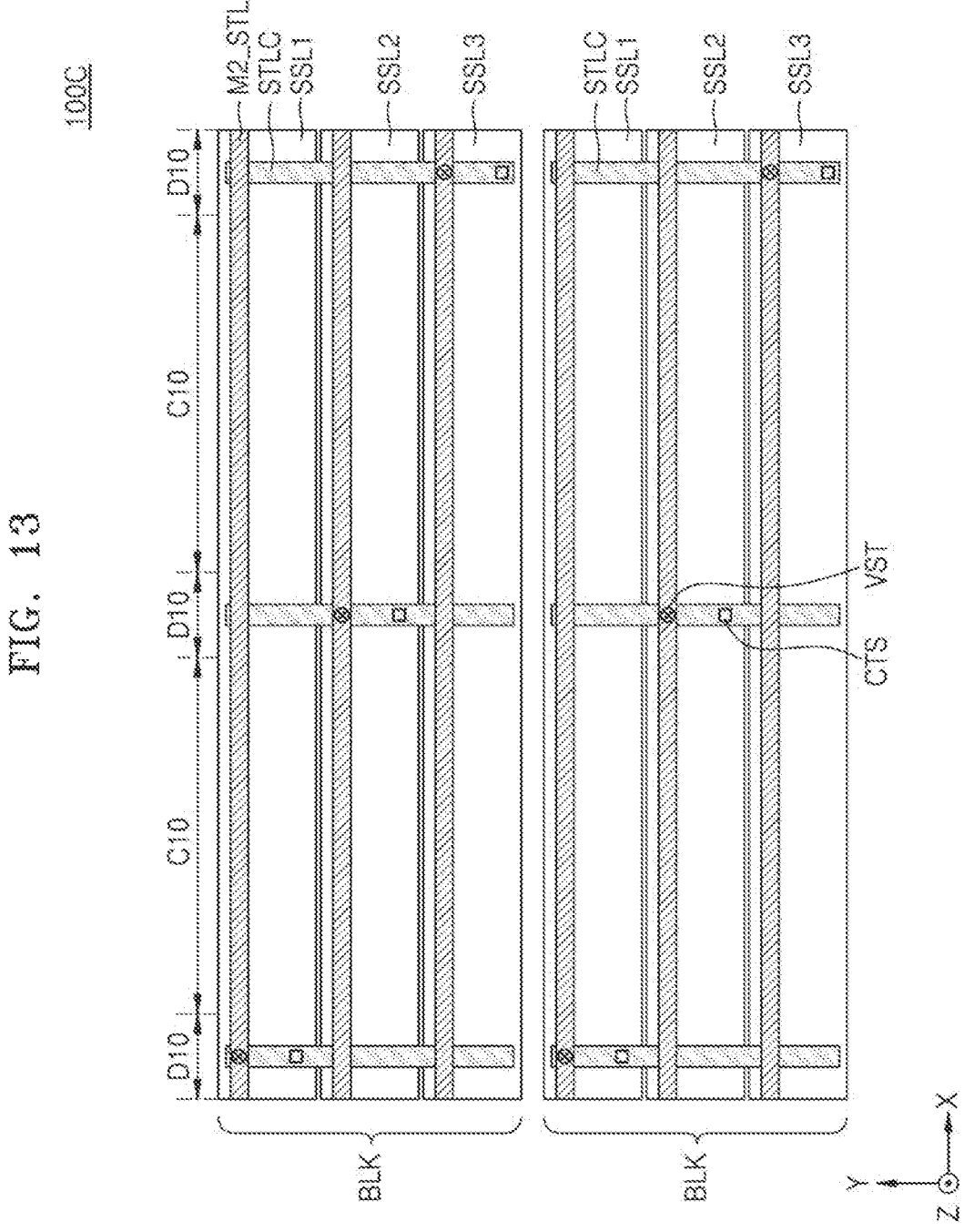

Referring to FIG. 13, in a semiconductor device 100C, one memory cell block BLK may include first to third string select lines SSL1, SSL2, and SSL3, and a common strapping line STLC may be disposed to vertically overlap all of the first to third string select lines SSL1, SSL2, and SSL3. A common strapping line STLC disposed in one dummy memory cell area D10 may be connected to a first string select line SSL1, a common strapping line STLC disposed in another dummy memory cell area D10 may be connected to a second string select line SSL2, and a common strapping line STLC disposed in another dummy memory cell area D10 may be connected to a third string select line SSL3.

The strapping wiring M2_STL may extend in the first horizontal direction X over the entire length of the memory cell block BLK in the first horizontal direction X. The strapping wiring M2_STL electrically connected to the first string select line SSL1 may be arranged to vertically overlap the first string select line SSL1, the strapping wiring M2_STL electrically connected to the second string select line SSL2 may be arranged to vertically overlap the second string select line SSL2, and the strapping wiring M2_STL electrically connected to the third string select line SSL3 may be arranged to vertically overlap the third string select line SSL3.

Figure 14:
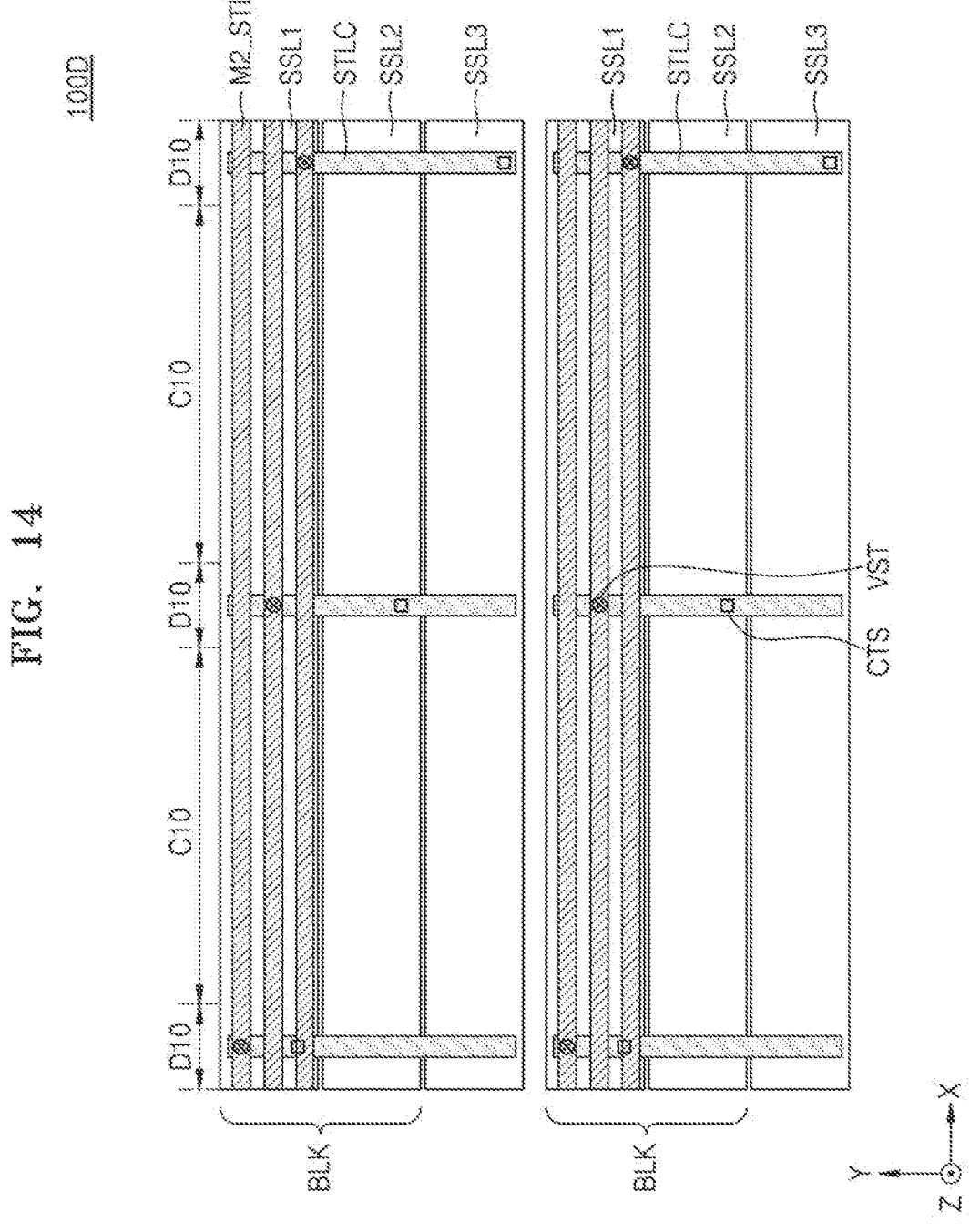

Referring to FIG. 14, a semiconductor device 100D may be similar to the semiconductor device 100C described with reference to FIG. 13 except for the arrangement of the strapping wiring M2_STL. The strapping wirings M2_STL connected to the first to third string select lines SSL1, SSL2, and SSL3 may be disposed adjacent to each other with a relatively small separation distance. For example, as shown in FIG. 14, all of the strapping wiring M2_STL electrically connected to the first string select line SSL1, the strapping wiring M2_STL electrically connected to the second string select line SSL2, and the strapping wiring M2_STL electrically connected to the third string select line SSL3 may be arranged to vertically overlap the first string select line SSL1.

Since the plurality of strapping wirings M2_STL corresponding to one memory cell block BLK are disposed adjacent to each other, the degree of freedom for designing or placing signal wiring on a vertical level such as strapping wiring M2_STL may be improved.

Figure 15:
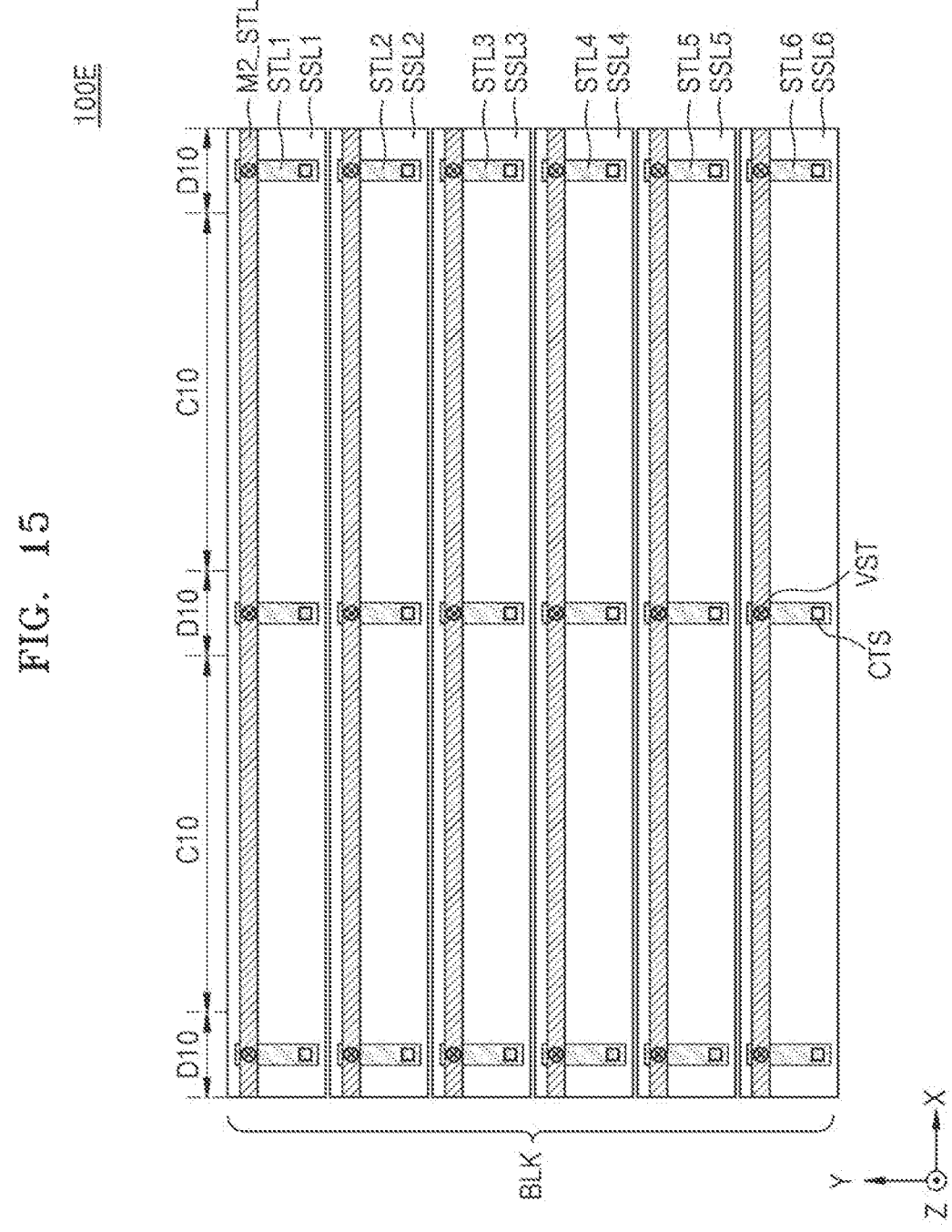

Referring to FIG. 15, in a semiconductor device 100E, one memory cell block BLK may include first to sixth string select lines SSL1 to SSL6, and the first to sixth strapping lines STL1 to STL6 may be connected to the first to sixth string select lines SSL1 to SSL6, respectively. The first to sixth strapping lines STL1 to STL6 may be electrically connected to the first to sixth string select lines SSL1 to SSL6 through the strapping contact CTS.

The first to sixth strapping lines STL1 to STL6 may be electrically connected to the strapping wiring M2_STL through the strapping via VST. FIG. 15 shows as an example that the strapping wiring M2_STL is connected to each of the first to sixth strapping lines STL1 to STL6. Accordingly, six strapping wirings M2_STL may be arranged on one memory cell block BLK.

Figure 16:
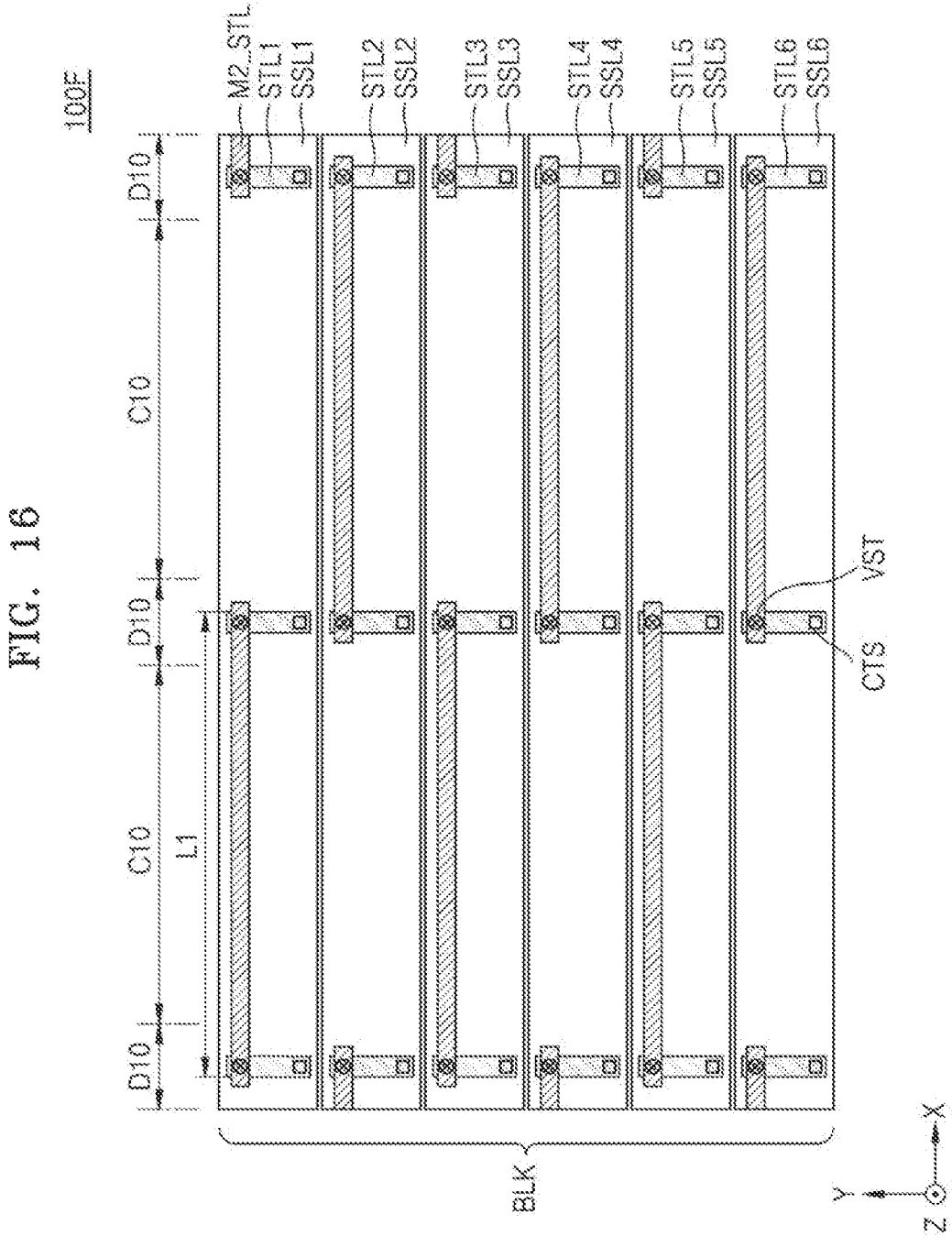

Referring to FIG. 16, in a semiconductor device 100F, the strapping wiring M2_STL having a total length corresponding to ½ of the total length of the strapping wiring M2_STL described with reference to FIG. 15 may be connected to each of the first to sixth strapping lines STL1 to STL6. For example, in one memory cell block BLK, a strapping wiring M2_STL having a first length L1 on the first string select line SSL1 may be disposed in every other memory cell area C10. For example, a strapping wiring M2_STL may be disposed in an even-numbered memory cell area C10 on one first string select line SSL1, or a strapping wiring M2_STL may be arranged in an odd-numbered memory cell area C10 on one first string select line SSL1.

For one memory cell area C10, the strapping wiring M2_STL may be disposed on the first, third, and fifth string select lines SSL1, SSL3, and SSL5, and the strapping wiring M2_STL may not be disposed on the second, fourth, and sixth string select lines SSL2, SSL4, and SSL6. For another memory cell area C10 adjacent to the one memory cell area C10, the strapping wiring M2_STL may not be placed on the first, third, and fifth string select lines SSL1, SSL3, and SSL5, and the strapping wiring M2_STL may be disposed on the second, fourth, and sixth string select lines SSL2, SSL4, and SSL6.

Figure 17:
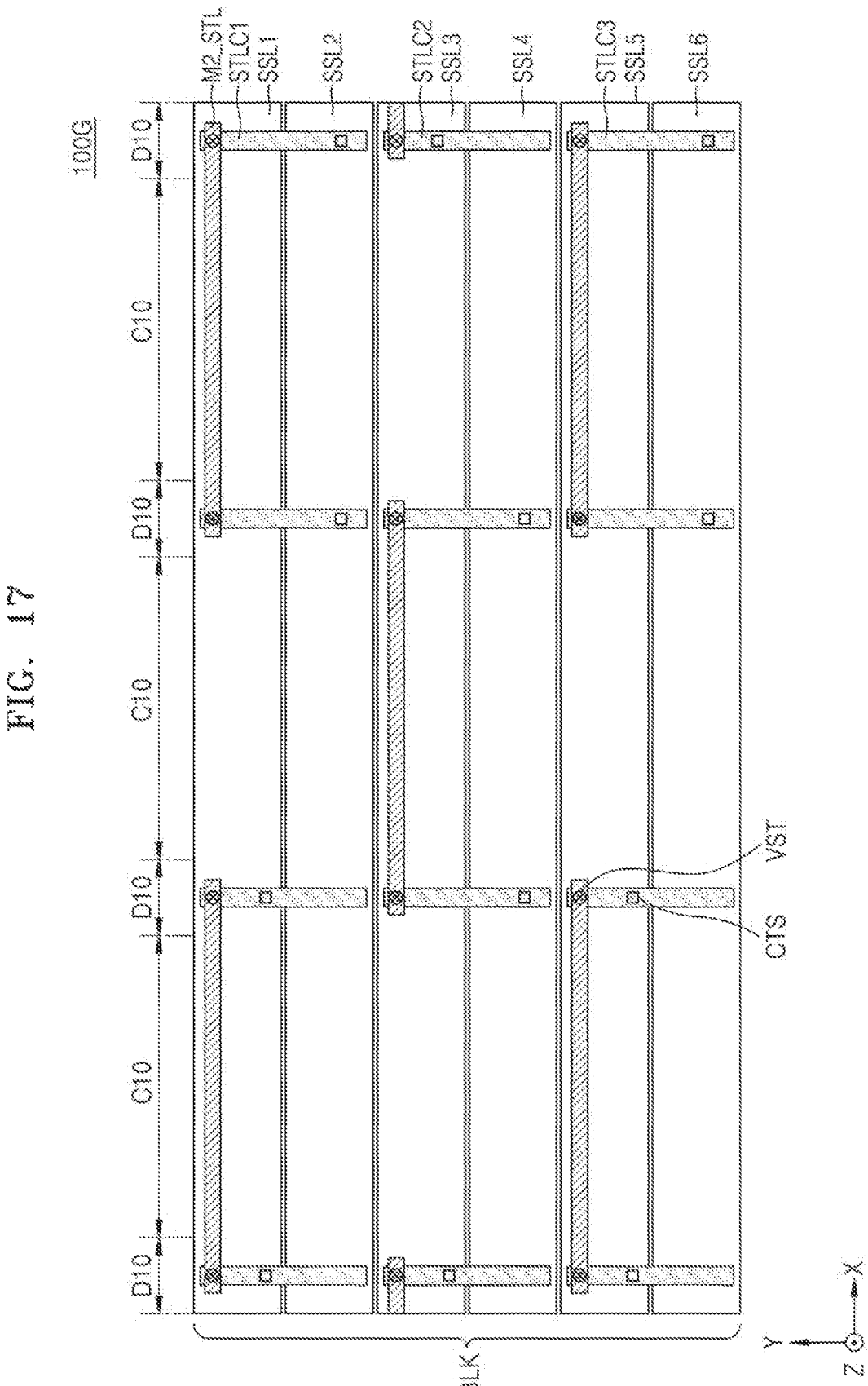

Referring to FIG. 17, one memory cell block BLK in a semiconductor device 100G may include first to sixth string select lines SSL1 to SSL6, a first common strapping line STLC1 may be disposed to vertically overlap the first and second string select lines SSL1 and SSL2, a second common strapping line STLC2 may be disposed to vertically overlap the third and fourth string select lines SSL3 and SSL4, and a third common strapping line STLC3 may be arranged to vertically overlap the fifth and sixth string select lines SSL5 and SSL6.

Two first common strapping lines STLC1 disposed adjacent to each other may be connected to a first string select line SSL1, and two other first common strapping lines STLC1 disposed adjacent to each other may be connected to the second string select line SSL2. In addition, two second common strapping lines STLC2 disposed adjacent to each other may be connected to the third string select line SSL3, and two other second common strapping lines STLC2 disposed adjacent to each other may be connected to the fourth string select line SSL4. Similarly, two third common strapping lines STLC3 disposed adjacent to each other may be connected to the fifth string select line SSL5, and two other third common strapping lines STLC3 disposed adjacent to each other may be connected to the sixth string select line SSL6.

The strapping wiring M2_STL may be arranged to have a total length corresponding to ¼ of the total length of the strapping wiring M2_STL described with reference to FIG. 15. For example, in one memory cell area C10 (e.g., in the memory cell area C10 disposed on the left side of FIG. 17), the strapping wiring M2_STL may be disposed on the first string select line SSL1 and the fifth string select line SSL5, and may be electrically connected to the first string select line SSL1 and the fifth string select line SSL5 through the first common strapping line STLC1 and the third common strapping line STLC3, respectively. In another memory cell area C10 adjacent to the one memory cell area C10 (e.g., in the memory cell area C10 disposed in the center of FIG. 17), the strapping wiring M2_STL may be disposed on the third string select line SSL3 and may be electrically connected to the fourth string select line SSL4 through the second common strapping line STLC2. In another memory cell area C10 adjacent to the other memory cell area C10 (e.g., in the memory cell area C10 disposed on the right side of FIG. 17), the strapping wiring M2_STL may be disposed on the first string select line SSL1 and may be electrically connected to the second string select line SSL2 through the first common strapping line STLC1.

Figure 18:
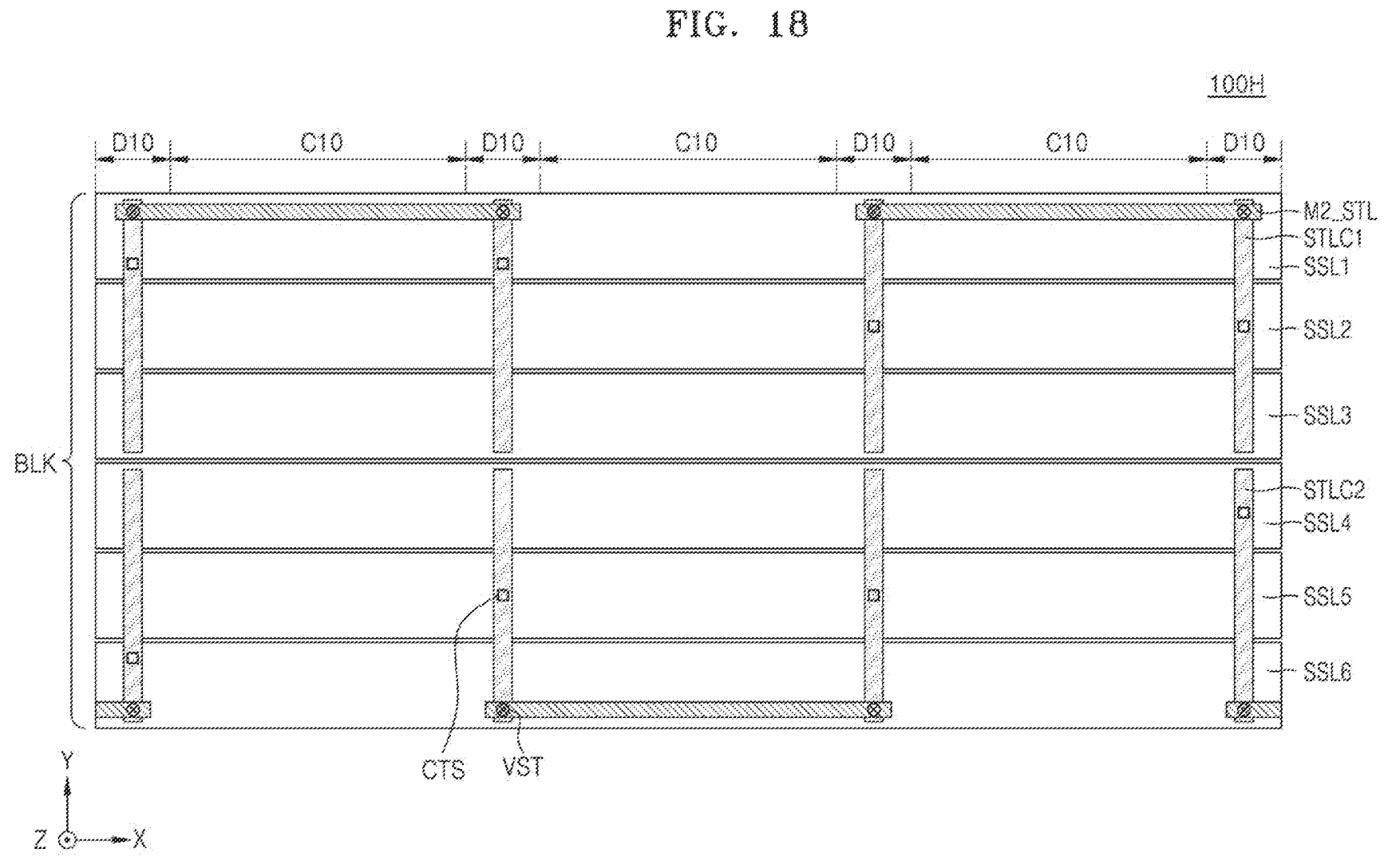

Referring to FIG. 18, in a semiconductor device 100H, one memory cell block BLK may include first to sixth string select lines SSL1 to SSL6, a first common strapping line STLC1 may be disposed to vertically overlap the first to third string select lines SSL1, SSL2, and SSL3, and the second common strapping line STLC2 may be arranged to vertically overlap the fourth to sixth string select lines SSL4, SSL5, and SSL6.

Two first common strapping lines STLC1 disposed adjacent to each other may be connected to a first string select line SSL1, two other first common strapping lines STLC1 disposed adjacent to each other may be connected to the second string select line SSL2, and two other first common strapping lines STLC1 disposed adjacent to each other may be connected to the third string select line SSL3. Similarly, two second common strapping lines STLC2 disposed adjacent to each other may be connected to the fourth string select line SSL4, two other second common strapping lines STLC2 disposed adjacent to each other may be connected to the fifth string select line SSL5, and another two second common strapping lines STLC2 disposed adjacent to each other may be connected to the sixth string select line SSL6.

The strapping wiring M2_STL may be arranged to have a total length corresponding to ⅙ of the total length of the strapping wiring M2_STL described with reference to FIG. 15. For example, in one memory cell area C10 (e.g., in the memory cell area C10 disposed on the left side of FIG. 18), the strapping wiring M2_STL may be disposed on the first string select line SSL1 and may be electrically connected to the first string select line SSL1 through the first common strapping line STLC1. In another memory cell area C10 adjacent to one memory cell area C10 (e.g., in the memory cell area C10 disposed in the center of FIG. 18), the strapping wiring M2_STL may be disposed on the sixth string select line SSL6 and may be electrically connected to the fifth string select line SSL5 through the second common strapping line STLC2. In another memory cell area C10 adjacent to the other memory cell area C10 (e.g., in the memory cell area C10 disposed on the right side of FIG. 18), the strapping wiring M2_STL may be disposed on the first string select line SSL1 and may be electrically connected to the second string select line SSL2 through the first common strapping line STLC1.

Figure 19:
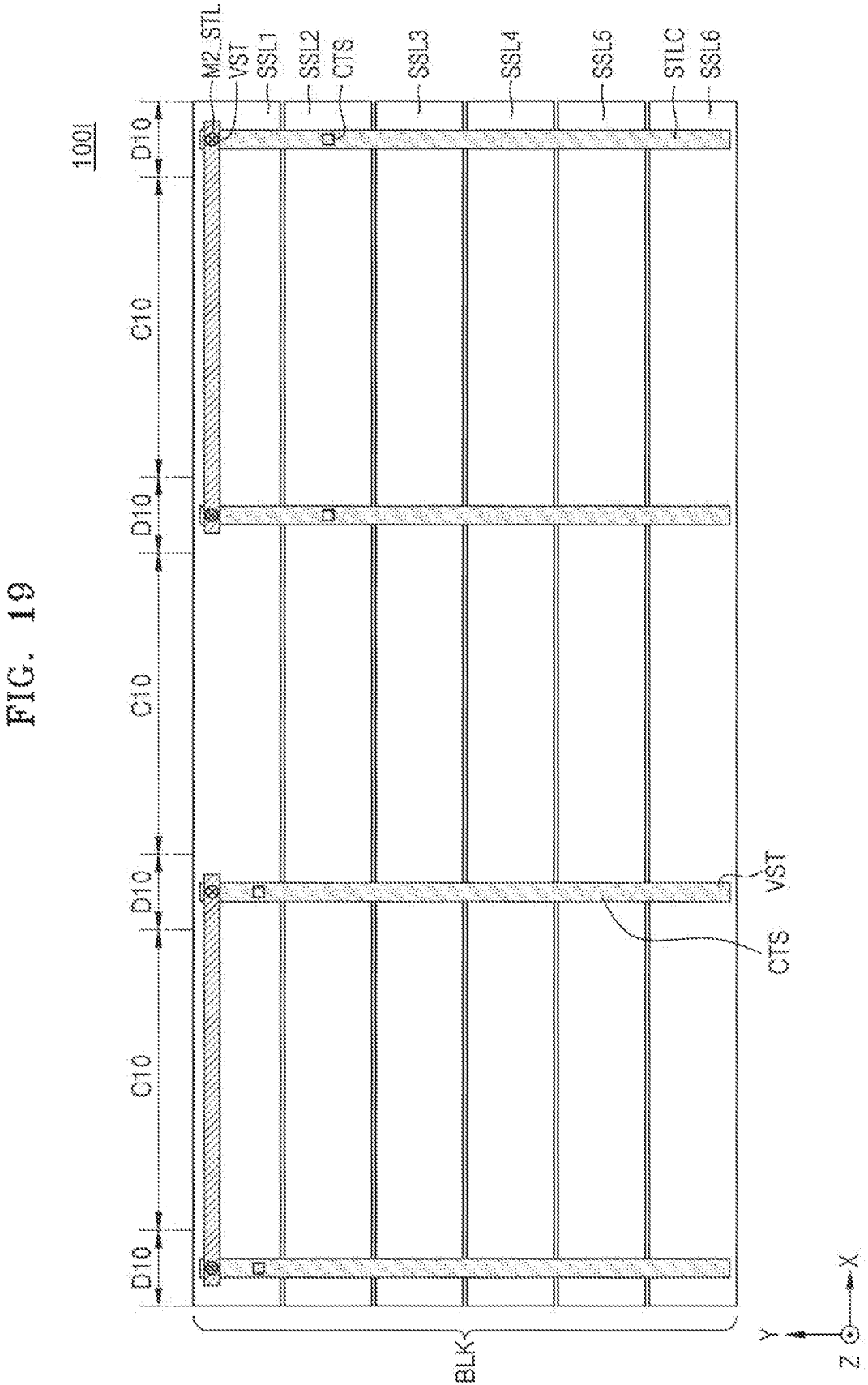

Referring to FIG. 19, in a semiconductor device 100I, one memory cell block BLK includes first to sixth string select lines SSL1 to SSL6, and a common strapping line STLC may be disposed to vertically overlap all of the first to sixth string select lines SSL1 to SSL6.

The strapping wiring M2_STL may be arranged to have a total length corresponding to ¹⁄₁₂ of the total length of the strapping wiring M2_STL described with reference to FIG. 15. For example, in one memory cell area C10 (e.g., in the memory cell area C10 disposed on the left side of FIG. 19), the strapping wiring M2_STL may be disposed on the first string select line SSL1, and may be electrically connected to the first string select line SSL1 through the common strapping line STLC, and in another memory cell area C10 adjacent to one memory cell area C10 (e.g., in the memory cell area C10 disposed in the center of FIG. 19), the strapping wiring M2_STL may not be disposed on the first to sixth string select lines SSL1 to SSL6. In another memory cell area C10 adjacent to the other memory cell area C10 (e.g., in the memory cell area C10 disposed on the right side of FIG. 19), the strapping wiring M2_STL may be disposed on the first string select line SSL1 and may be electrically connected to the second string select line SSL2 through the first common strapping line STLC1.

Figure 20:
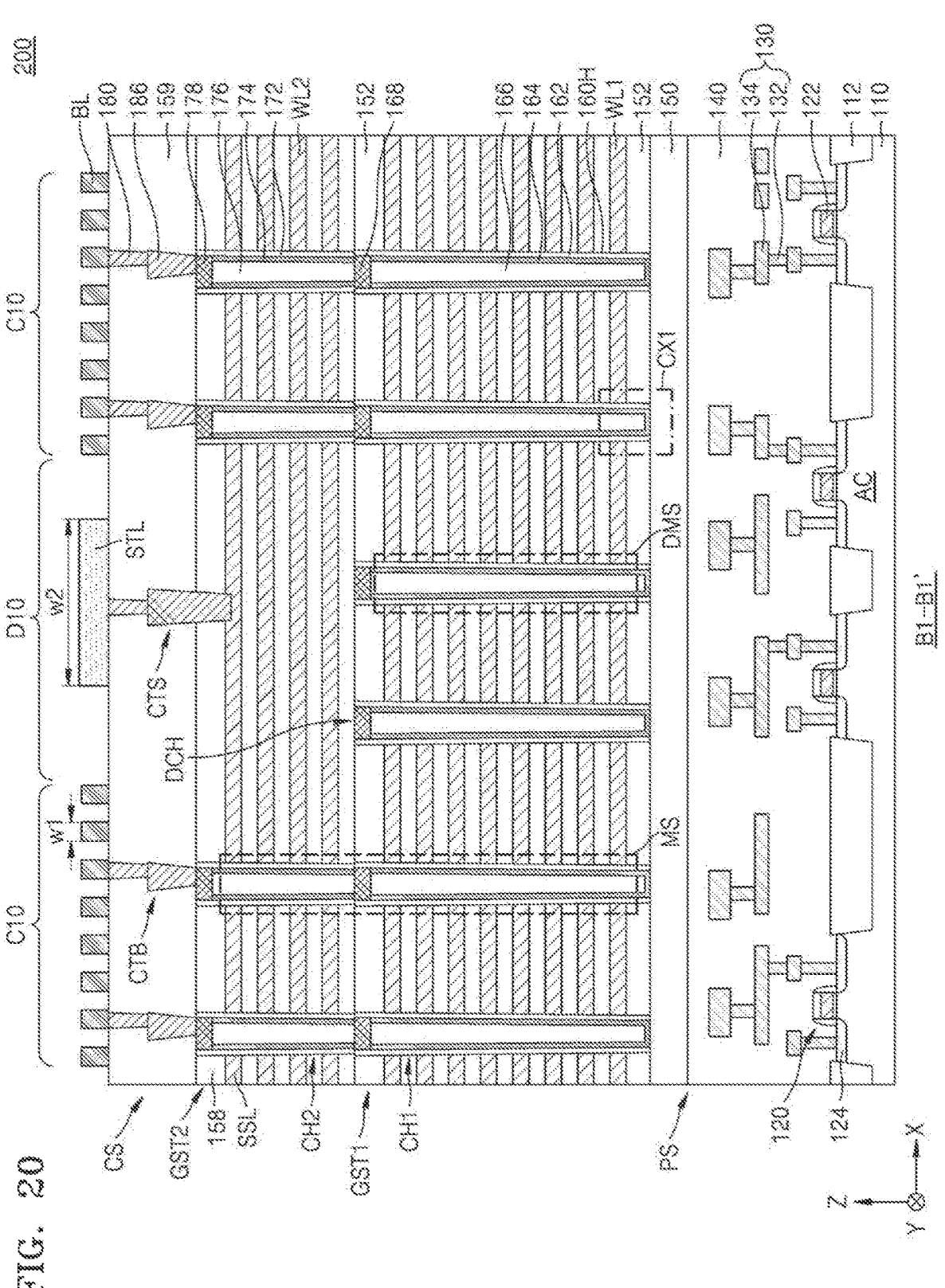
FIG. 20 is a cross-sectional view illustrating a semiconductor device according to some embodiments.

FIG. 20 is a cross-sectional view illustrating a semiconductor device 200 according to some embodiments.

Referring to FIG. 20, a first gate stack GST1 may be disposed on the common source plate 150, and a second gate stack GST2 may be disposed on the first gate stack GST1. The first gate stack GST1 may include a plurality of first word lines WL1 spaced apart in the vertical direction Z, and the second gate stack GST2 may include a plurality of second word lines WL2 spaced apart in the vertical direction Z and at least one string select line SSL disposed on the uppermost second word line WL2. In the embodiment shown in FIG. 20, at least one string select line SSL may be formed using the same material as the plurality of second word lines WL2.

In the memory cell area C10, the first channel CH1 and the second channel CH2 may form one memory string MS. The first channel CH1 may pass through the first gate stack GST1, and the second channel CH2 may pass through the second gate stack GST2.

A dummy memory string DMS passing through the first gate stack GST1 may be disposed in the dummy memory cell area D10. The dummy memory string DMS may include a dummy channel structure DCH extending in a vertical direction Z through the plurality of first word lines WL1, and a portion of the first word line WL1 around the dummy channel structure DCH. The dummy memory string DMS may be disposed at a position vertically overlapping the strapping line STL.

Figure 21:
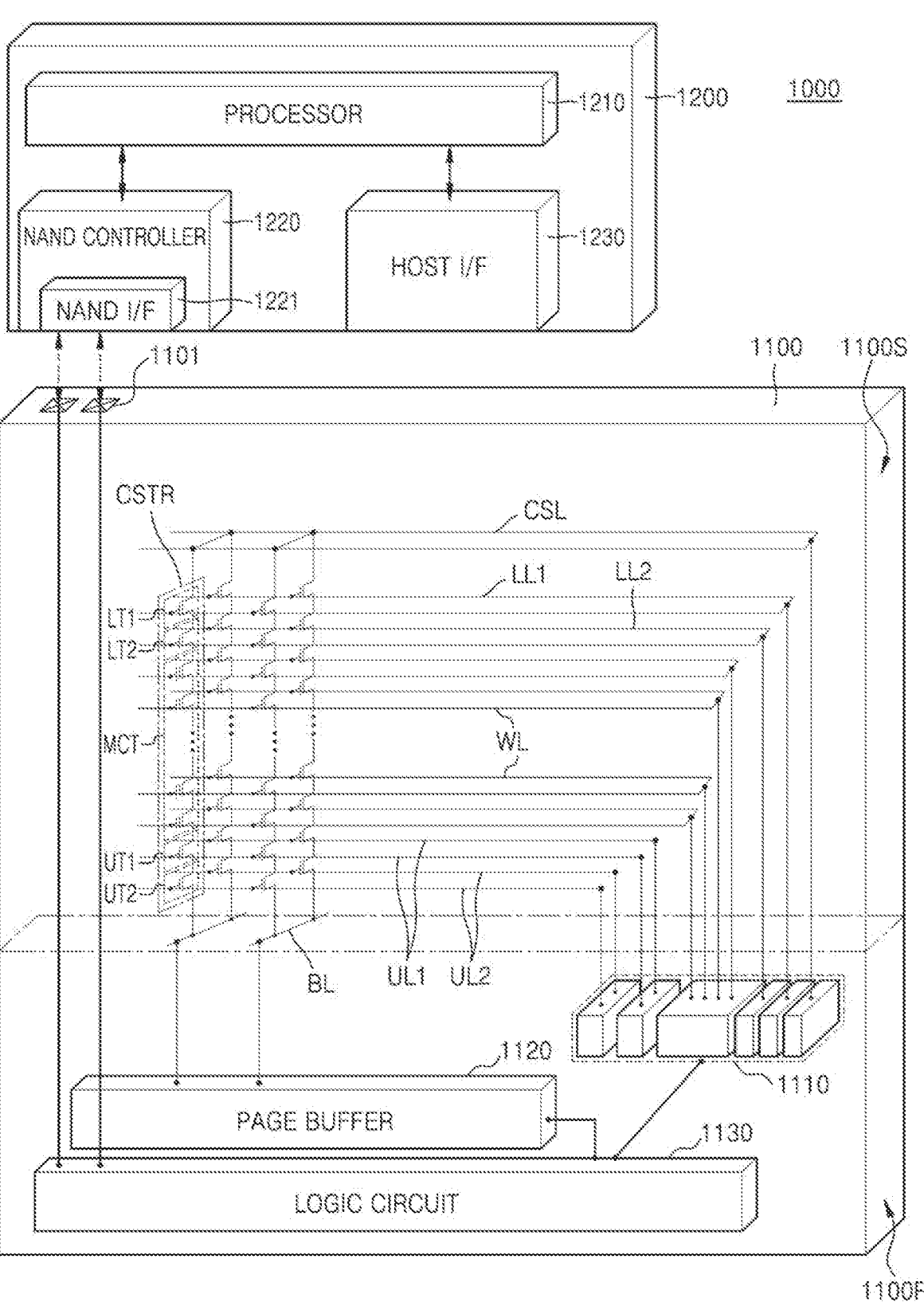
FIG. 21 is a diagram schematically illustrating a data storage system including a semiconductor device according to some embodiments.

FIG. 21 is a diagram schematically illustrating a data storage system 1000 including a semiconductor device according to some embodiments.

Referring to FIG. 21, the data storage system 1000 may include one or more semiconductor devices 1100 and a memory controller 1200 electrically connected to the semi-conductor device 1100. The data storage system 1000 may be, for example, a solid state drive (SSD) device including at least one semiconductor device 1100, a universal serial bus (USB), a computing system, a medical device, or a communication device.

The semiconductor device 1100 may be a non-volatile semiconductor device, and for example, the semiconductor device 1100 may be a NAND flash semiconductor device including one of the semiconductor devices 10, 100, 100A, 100B, 100C, 100D, 100E, 100F, 100G, 100H, 100I, and 200 described with reference to FIGS. 1 to 20. The semiconductor device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, a plurality of memory cell strings CSTR may include ground select transistors LT1 and LT2 adjacent to the common source line CSL, respectively, string select transistors UT1 and UT2 adjacent to the bit line BL, and a plurality of memory cell transistors MCT disposed between the ground select transistors LT1 and LT2 and the string select transistors UT1 and UT2. The number of ground select transistors LT1 and LT2 and the number of string select transistors UT1 and UT2 may be variously modified according to some embodiments.

In embodiments, the plurality of ground select lines LL1 and LL2 may be connected to gate electrodes of the ground select transistors LT1 and LT2, respectively. The word line WL may be connected to a gate electrode of the memory cell transistor MCT. The plurality of string select lines UL1 and UL2 may be respectively connected to gate electrodes of the string select transistors UT1 and UT2.

The common source line CSL, the plurality of ground select lines LL1 and LL2, the plurality of word lines WL, and the plurality of string select lines UL1 and UL2 may be connected to the row decoder 1110. The plurality of bit lines BL may be electrically connected to the page buffer 1120.

The semiconductor device 1100 may communicate with the memory controller 1200 through an input/output pad 1101 electrically connected to the logic circuit 1130. The input/output pad 1101 may be electrically connected to the logic circuit 1130.

The memory controller 1200 may include a processor 1210, a NAND controller 1220, and a host interface 1230. In some embodiments, the data storage system 1000 may include a plurality of semiconductor devices 1100, and in this case, the memory controller 1200 may control the plurality of semiconductor devices 1100.

The processor 1210 may control the overall operation of the data storage system 1000 including the memory controller 1200. The processor 1210 may operate according to preset firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the plurality of memory cell transistors MCT of the semiconductor device 1100, and data to be read from the plurality of memory cell transistors MCT of the semiconductor device 1100 may be transmitted. The host interface 1230 may provide a communication function between the data storage system 1000 and an external host. When receiving a control command from an external host through the host interface 1230, the processor 1210 may control the semiconductor device 1100 in response to the control command.

Figure 22:
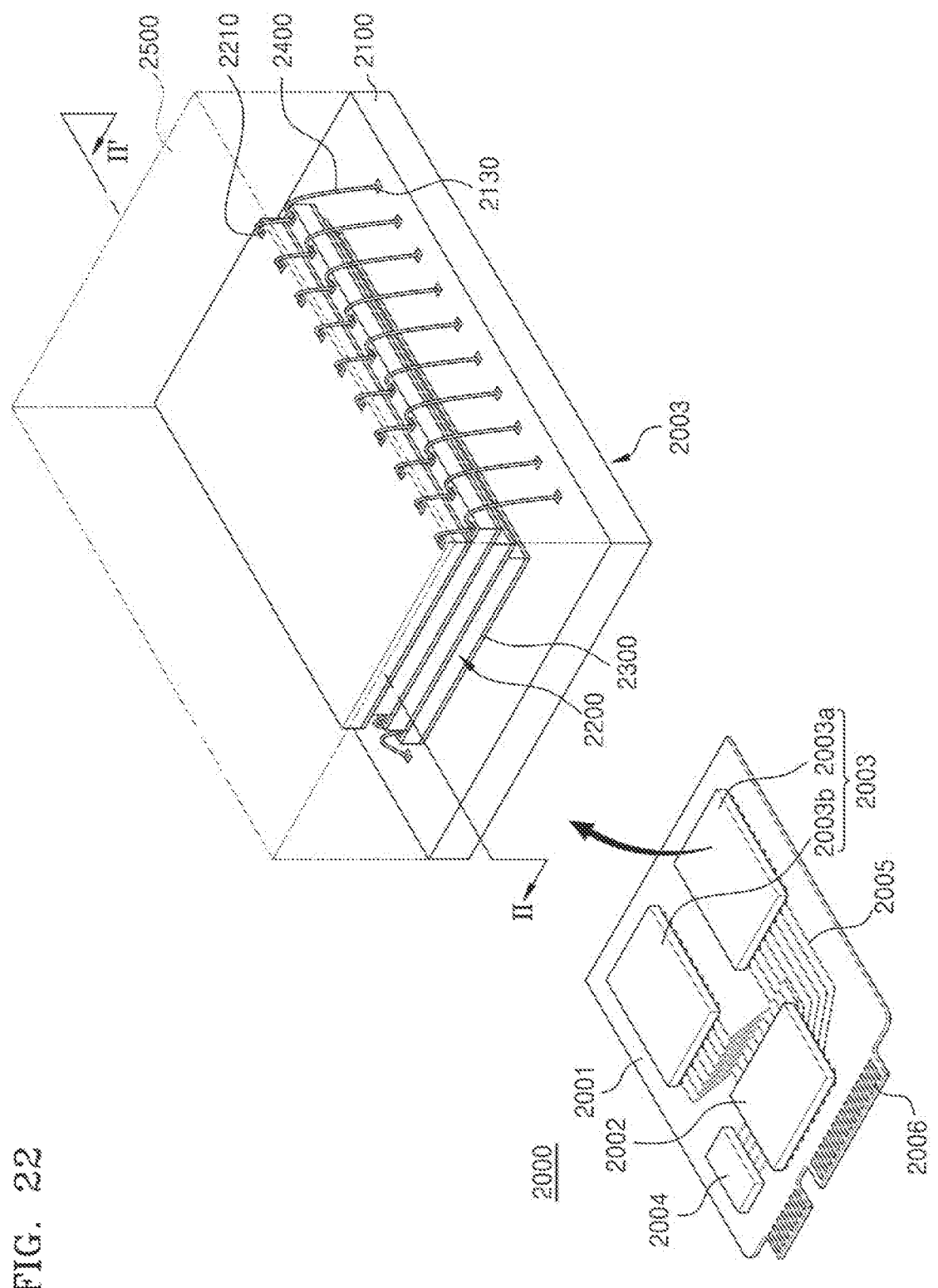
FIG. 22 is a perspective view schematically illustrating a data storage system including a semiconductor device according to some embodiments.

FIG. 22 is a perspective view schematically illustrating a data storage system 2000 including a semiconductor device according to some embodiments.

Referring to FIG. 22, a data storage system 2000 according to an embodiment may include a main board 2001, a memory controller 2002 mounted on the main board 2001, one or more semiconductor packages 2003, and a DRAM 2004. The semiconductor package 2003 and the DRAM 2004 may be connected to the memory controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In embodiments, the data storage system 2000 may communicate with an external host according to any one of the interfaces such as Universal Serial Bus (USB), Peripheral Component Interconnect Express (PCI-Express), Serial Advanced Technology Attachment (SATA), and M-Phy for Universal Flash Storage (UFS). In embodiments, the data storage system 2000 may operate by power supplied from an external host through the connector 2006. The data storage system 2000 may further include a power management integrated circuit (PMIC) for distributing power supplied from the external host to the memory controller 2002 and the semiconductor package 2003.

The memory controller 2002 may write data to or read data from the semiconductor package 2003, and may improve the operating speed of the data storage system 2000.

The DRAM 2004 may be a buffer memory for reducing a speed difference between the semiconductor package 2003, that is, a data storage space, and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the memory controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, a plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 21. Each of the plurality of semiconductor chips 2200 may include at least one of the semiconductor devices 10, 100, 100A, 100B, 100C, 100D, 100E, 100F, 100G, 100H, 100I, and 200 described with reference to FIGS. 1 to 20.

In embodiments, the connection structure 2400 may be a bonding wire electrically connecting the input/output pad 2210 and the package upper pad 2130. Accordingly, in the first and second semiconductor packages 2003a and 2003b, the plurality of semiconductor chips 2200 may be electrically connected to each other by a bonding wire method, and may be electrically connected to the package upper pad 2130 of the package substrate 2100. In embodiments, in relation to the first and second semiconductor packages 2003a and 2003b, the plurality of semiconductor chips 2200 may be electrically connected to each other by a connection structure including a through silicon via (TSV) instead of the bonding wire type connection structure 2400.

In embodiments, the memory controller 2002 and the plurality of semiconductor chips 2200 may be included in one package. In an embodiment, the memory controller 2002 and the plurality of semiconductor chips 2200 are mounted on a separate interposer board different from the main board 2001, and the memory controller 2002 and the plurality of semiconductor chips 2200 may be connected to each other by wiring formed on the interposer substrate.

Figure 23:
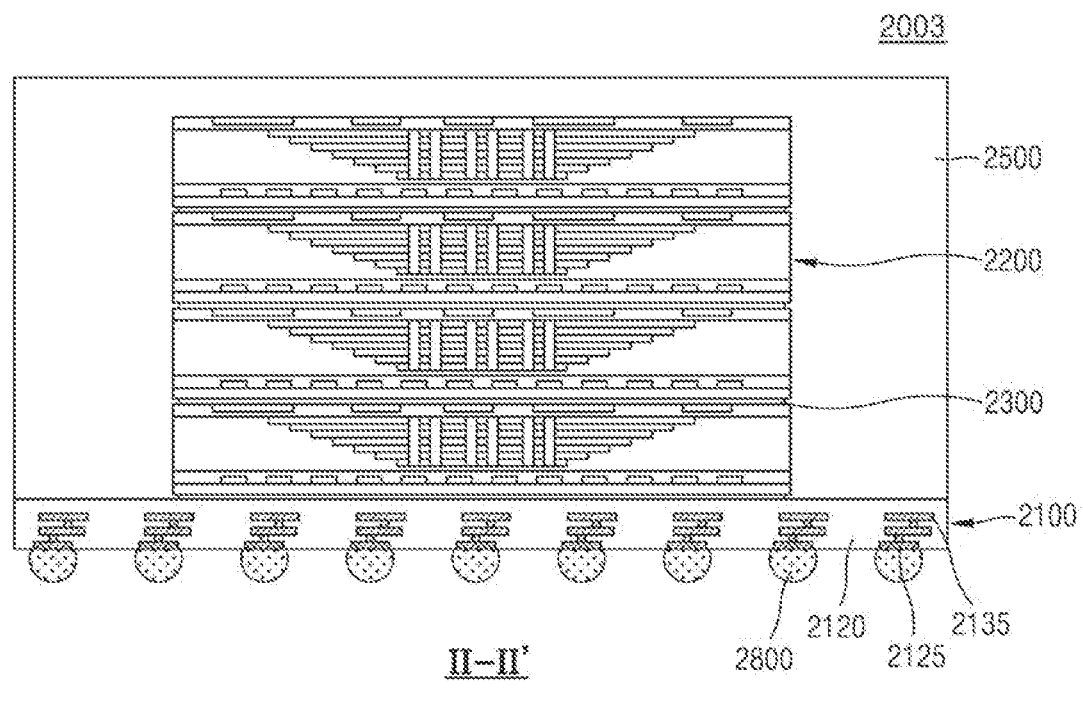
FIG. 23 is a schematic cross-sectional view of semiconductor packages according to some embodiments.

FIG. 23 is a cross-sectional view schematically illustrating semiconductor packages 2003 according to some embodiments. FIG. 23 is a cross-sectional view taken along line II-II' of FIG. 22.

Referring to FIG. 23, in the semiconductor package 2003, the package substrate 2100 may be a printed circuit board. The package substrate 2100 may include a package substrate body part 2120, a plurality of package upper pads 2130 (refer to FIG. 22) disposed on the upper surface of the package substrate body part 2120, a plurality of lower pads 2125 disposed on or exposed through the lower surface of the package substrate body 2120, and a plurality of internal wirings 2135 that electrically connect the plurality of package upper pads 2130 (refer to FIG. 22) and the plurality of lower pads 2125 in the package substrate body part 2120. As shown in FIG. 23, the plurality of package upper pads 2130 may be electrically connected to the plurality of connection structures 2400. As shown in FIG. 23, the plurality of lower pads 2125 may be connected to the plurality of wiring patterns 2005 on the main board 2001 of the data storage system 2000 shown in FIG. 22 through the plurality of conductive bumps 2800. Each of the plurality of semiconductor chips 2200 may include at least one of the semiconductor devices 10, 100, 100A, 100B, 100C, 100D, 100E, 100F, 100G, 100H, 100I, and 200 described with reference to FIGS. 1 to 20.

While various embodiments have been particularly shown and described with reference to the drawings, it will be understood that various changes in form and details may be made therein without departing from the spirit and scope of the following claims.

What is claimed is:

1. A semiconductor device comprising:
   a plurality of word lines disposed on a substrate and spaced apart in a first direction perpendicular to an upper surface of the substrate;
   a string select line disposed on the plurality of word lines;

a plurality of memory strings extending in the first direction on the substrate, wherein each memory string comprises:
  a first channel extending in the first direction through the plurality of word lines;
  a plurality of memory cells constituted by the plurality of word lines around the first channel;
  a second channel extending in the first direction through the string select line and not through any of the plurality of wordlines; and
  a string select transistor constituted by the string select line around the second channel;
a plurality of bit lines electrically connected to the plurality of memory strings; and
a strapping line connected to the string select line.

2. The semiconductor device of claim 1, wherein each of the plurality of bit lines has a first width and the strapping line has a second width that is greater than the first width, and
  wherein the strapping line is disposed at a same vertical level from the substrate as each of the plurality of bit lines.

3. The semiconductor device of claim 1, wherein a bottom surface of the second channels is disposed at a vertical level higher than an uppermost word line among the plurality of word lines, and a top surface of the first channel is disposed at a vertical level higher than the uppermost word line.

4. The semiconductor device of claim 3, wherein each of the plurality of bit lines is electrically connected to the string select transistor, and
  wherein the string select transistor does not vertically overlap the strapping line.

5. The semiconductor device of claim 4, further comprising a dummy memory string that vertically overlaps the strapping line, and that includes a dummy channel structure penetrating the plurality of word lines,
  wherein the string select line is disposed on the dummy channel structure, and
  wherein the dummy memory string does not comprise a string select transistor.

6. The semiconductor device of claim 3, wherein each of the plurality of word lines has a first height in the first direction,
  wherein the string select line has a second height in the first direction that is greater than the first height.

7. The semiconductor device of claim 3, wherein a center line of the second channel is disposed horizontally apart from a center line of the first channel.

8. The semiconductor device of claim 1, wherein the string select line comprises at least one of doped polysilicon, tungsten, nickel, cobalt, tantalum, tungsten silicide, nickel silicide, cobalt silicide, tantalum silicide, tungsten nitride, titanium nitride, and tantalum nitride.

9. The semiconductor device of claim 1, further comprising a strapping wiring electrically connected to the strapping line at a higher vertical level than the strapping line.

10. A semiconductor device comprising:
a peripheral circuit disposed on a substrate; and
a memory cell stack disposed on the peripheral circuit,
wherein the memory cell stack comprises:
a common source plate;
a plurality of word lines spaced apart from each other in a first direction perpendicular to an upper surface of the substrate on the common source plate;
a string select line disposed on the plurality of word lines;
a plurality of memory strings extending in the first direction on the common source plate, wherein each memory string comprises a first channel extending in the first direction through the plurality of word lines and a second channel extending in the first direction through the string select line;
a plurality of bit lines electrically connected to the plurality of memory strings; and
a strapping line connected to the string select line,
wherein the memory cell stack comprises a main block and a dummy block,
wherein the main block comprises a memory cell area and a dummy memory cell area,
wherein the plurality of bit lines extend in a first horizontal direction on a first portion of the plurality of word lines disposed in the memory cell area, and
wherein the strapping line extends in the first horizontal direction on a second portion of the plurality of word lines disposed in the dummy memory cell area.

11. The semiconductor device of claim 10, wherein the memory cell stack further comprises a common source tapping line disposed in the dummy block and extending in the first horizontal direction.

12. The semiconductor device of claim 11, wherein the common source tapping line is disposed in a straight line with the strapping line in a second horizontal direction, and
  wherein the common source tapping line is electrically connected to the common source plate through a common source contact extending in the first direction from the dummy block.

13. The semiconductor device of claim 10, wherein the string select line disposed in the main block comprises a first string select line, a second string select line, and a third string select line disposed apart from each other in the first horizontal direction, and
  wherein the strapping line is electrically connected to at least one of the first string select line, the second string select line, and the third string select line through a strapping contact.

14. The semiconductor device of claim 10, wherein the string select line disposed in the main block comprises a first string select line, a second string select line, and a third string select line disposed apart from each other in the first horizontal direction, and
  wherein the strapping line comprises:
    a first strapping line electrically connected to the first string select line through a first strapping contact;
    a second strapping line electrically connected to the second string select line through a second strapping contact; and
    a third strapping line electrically connected to the third string select line through a third strapping contact.

15. The semiconductor device of claim 10, further comprising a dummy memory string arranged in the dummy memory cell area,
  wherein the dummy memory string comprises a dummy channel structure penetrating the second portion of the plurality of word lines, and
  wherein the strapping line is disposed on the dummy channel structure.

16. The semiconductor device of claim 10, wherein a center of the second channel is disposed horizontally spaced apart from a center of the first channel.

17. An electronic system comprising:
a main board;
a semiconductor device on the main board; and
a controller electrically connected to the semiconductor device on the main board, wherein the semiconductor device comprises:

a peripheral circuit disposed on a substrate; and a memory cell stack disposed on the peripheral circuit, the memory cell stack comprising:

a common source plate;

a plurality of word lines spaced apart from each other in a first direction perpendicular to an upper surface of the substrate on the common source plate;

a string select line disposed on the plurality of word lines;

a plurality of memory strings extending in the first direction on the common source plate, wherein each memory string comprises a first channel extending in the first direction through the plurality of word lines and a second channel extending in the first direction through the string select line;

a plurality of bit lines electrically connected to the plurality of memory strings; and a strapping line connected to the string select line, wherein the memory cell stack comprises a main block and a dummy block, wherein the main block comprises a memory cell area and a dummy memory cell area, wherein the plurality of bit lines extend in a first horizontal direction on a first portion of the plurality of word lines disposed in the memory cell area, and wherein the strapping line extends in the first horizontal direction on a second portion of the plurality of word lines disposed in the dummy memory cell area.

18. The electronic system of claim 17, wherein the string select line comprises a first string select line, a second string select line, and a third string select line disposed apart from each other in the first horizontal direction, and wherein the strapping line is electrically connected to at least one of the first string select line, the second string select line, and the third string select line through a strapping contact.

* * * * *